United States Patent
Ishii et al.

(10) Patent No.: US 10,840,057 B2
(45) Date of Patent: Nov. 17, 2020

(54) MULTIPLE BEAM INSPECTION APPARATUS AND SENSITIVITY CORRECTION METHOD FOR MULTI-DETECTOR

(71) Applicant: NuFlare Technology, Inc., Yokohama (JP)

(72) Inventors: Koichi Ishii, Kawasaki (JP); Atsushi Ando, Edogawa-ku (JP)

(73) Assignee: NuFlare Technology, Inc., Yokohama (JP)

( * ) Notice: Subject to any disclaimer, the term of this patent is extended or adjusted under 35 U.S.C. 154(b) by 128 days.

(21) Appl. No.: 16/237,768

(22) Filed: Jan. 2, 2019

(65) Prior Publication Data

US 2019/0214221 A1     Jul. 11, 2019

(30) Foreign Application Priority Data

Jan. 11, 2018 (JP) .................... 2018-002957

(51) Int. Cl.
*H01J 37/147* (2006.01)
*H01J 37/244* (2006.01)
(Continued)

(52) U.S. Cl.
CPC ........ *H01J 37/147* (2013.01); *G01N 23/2251* (2013.01); *H01J 37/244* (2013.01);
(Continued)

(58) Field of Classification Search
CPC ...... H01J 37/147; H01J 37/244; H01J 37/265; H01J 2237/24465; H01J 2237/2448;
(Continued)

(56) References Cited

U.S. PATENT DOCUMENTS

| 8,330,103 B2 | 12/2012 | Enyama et al. |
| 2005/0214958 A1* | 9/2005 | Nakasuji ................ H01J 37/28 438/14 |

(Continued)

FOREIGN PATENT DOCUMENTS

| JP | 2006-253537 A | 9/2006 |
| JP | 2009-9882 | 1/2009 |

(Continued)

OTHER PUBLICATIONS

Korean Office Action dated Feb. 26, 2020 in Korean Patent Application No. 10-2019-0002885 (with unedited computer generated English translation), 12 pages.

*Primary Examiner* — Brooke Purinton
(74) *Attorney, Agent, or Firm* — Oblon, McClelland, Maier & Neustadt, L.L.P.

(57) ABSTRACT

A multiple beam inspection apparatus includes a multi-detector to detect multiple secondary electron beams generated because a target object is irradiated with multiple primary electron beams, and to include plural detection pixels each receiving irradiation of a corresponding one of the multiple secondary electron beams, and having a region which receives irradiation of a corresponding secondary electron beam and is larger than the irradiation spot size of the corresponding secondary electron beam, a shifting mechanism to shift irradiation positions of the multiple secondary electron beams irradiating the plural detection pixels, a determination circuitry to determine whether sensitivity of at least one of the plural detection pixels is degraded, and a setting circuitry to set, when sensitivity of at least one detection pixel is degraded, irradiation position shifting destinations of multiple secondary electron beams, irradiating the plural detection pixels, to be within respective corresponding same detection pixels.

10 Claims, 15 Drawing Sheets

(51) Int. Cl.
  *G01N 23/2251* (2018.01)
  *H01J 37/26* (2006.01)
(52) U.S. Cl.
  CPC ..... *H01J 37/265* (2013.01); *H01J 2237/2448* (2013.01); *H01J 2237/24465* (2013.01)
(58) Field of Classification Search
  CPC ............... H01J 2237/2826; H01J 37/28; H01J 2237/2446; H01J 2237/24592; G01N 23/2251
  See application file for complete search history.

(56) References Cited

U.S. PATENT DOCUMENTS

| | | |
|---|---|---|
| 2011/0155905 A1 | 6/2011 | Hatakeyama et al. |
| 2012/0061565 A1 | 3/2012 | Enyama et al. |
| 2013/0050689 A1* | 2/2013 | Reich ..................... G01N 21/94 |
| | | 356/237.4 |
| 2017/0154756 A1* | 6/2017 | Ren ....................... H01J 37/292 |

FOREIGN PATENT DOCUMENTS

| | | |
|---|---|---|
| JP | 2014-52379 A | 3/2014 |
| JP | 5497980 | 5/2014 |
| JP | 5498488 B2 | 5/2014 |

* cited by examiner

MULTIPLE BEAM INSPECTION APPARATUS AND SENSITIVITY CORRECTION METHOD FOR MULTI-DETECTOR

CROSS-REFERENCE TO RELATED APPLICATION

This application is based upon and claims the benefit of priority from prior Japanese Patent Application No. 2018-002957 filed on Jan. 11, 2018 in Japan, the entire contents of which are incorporated herein by reference.

BACKGROUND OF THE INVENTION

Field of the Invention

Embodiments of the present invention relate to a multiple beam inspection apparatus and a sensitivity correction method for a multi-detector. For example, embodiments of the present invention relate to a method for correcting degradation in sensitivity of a multi-detector which acquires images for inspection using multiple beams.

Description of Related Art

In recent years, with the advance of high integration and large capacity of LSI (Large Scale Integration or Integrated circuits), the line width (critical dimension) required for circuits of semiconductor elements is becoming increasingly narrower. Such semiconductor elements are manufactured by forming a circuit byway of exposing and transferring a pattern onto a wafer, utilizing a reduced projection exposure apparatus known as a stepper, while using an original or "master" pattern (also called a mask or a reticle, hereinafter generically referred to as a mask) with a circuit pattern formed thereon.

Since LSI manufacturing requires a tremendous amount of manufacturing cost, it is crucial to improve its yield. However, as typified by a 1-gigabit DRAM (Dynamic Random Access Memory), the scale of patterns configuring the LSI has become on the order of nanometers from submicrons. Also, in recent years, with miniaturization of dimensions of LSI patterns formed on a semiconductor wafer, dimension to be detected as a pattern defect has become extremely small. Therefore, the pattern inspection apparatus which inspects defects of ultrafine patterns transferred and exposed on the semiconductor wafer needs to be highly accurate. Further, one of major factors that decrease the yield of the LSI manufacturing is due to pattern defects on the mask used for exposing and transferring an ultrafine pattern on a semiconductor wafer by the photolithography technology. Therefore, the pattern inspection apparatus which inspects defects on a transfer mask used in manufacturing LSI needs to be highly accurate.

As an inspection method, there is known a method of comparing a measured image captured by imaging a pattern formed on the substrate, such as a semiconductor wafer and a lithography mask, with design data or with another measured image obtained by imaging an identical pattern on the substrate. For example, the methods described below are known as pattern inspection, "die-to-die inspection" and "die-to-database inspection": the "die-to-die inspection" method compares data of measured images obtained by imaging identical patterns at different positions on the same substrate; and the "die-to-database inspection" method generates design image data (reference image), based on pattern design data, to be compared with a measured image serving as measured data obtained by imaging a pattern. In such inspection methods for use in the inspection apparatus, inspection is performed due to that an inspection substrate is placed on the stage so that the target object may be scanned with a light flux along with the stage movement. Specifically, the substrate to be inspected is irradiated with a light flux from the light source through the illumination optical system. A light transmitted through the inspection substrate or reflected therefrom forms an image on a sensor through the optical system. Then, the image obtained by the sensor is transmitted as measured data to the comparison circuit. After providing alignment between images, the comparison circuit compares the measured data with the reference data in accordance with an appropriate algorithm, and determines that there is a pattern defect if the compared data are not identical.

In addition to the pattern inspection apparatus described above which acquires an optical image by irradiating the inspection substrate with laser beams in order to obtain a transmission image or a reflection image of a pattern formed on the substrate, there has been developed an inspection apparatus which acquires a pattern image by scanning the inspection substrate with electron beams and detecting secondary electrons emitted from the inspection substrate by irradiation with the electron beams. Further, with respect to the inspection apparatus using electron beams, an apparatus using multiple beams has also been developed. In the multiple beam inspection apparatus, since it is necessary to detect a plurality of secondary electron beams at a time, a plurality of detectors are needed (e.g., refer to Japanese Patent Application Laid-open (JP-A) No. 2009-009882). If each of a plurality of detectors needs to be arranged for each beam, not only a large arrangement space but also highly accurate position adjustment is required, and therefore, a multipixel multi-detector becomes effective. Then, with respect to the multi-detector, if the detection sensitivity degrades in any one of pixels, it becomes necessary to correct a measured image by using information on surrounding pixels, or to replace the multi-detector itself. When the number of pixels is equivalent to the number of electron beams, if performing correction using information on surrounding pixels, information rate per beam becomes large against the pattern dimension accuracy required for inspection. Therefore, there is a problem in that lack of information from a pixel with degraded sensitivity greatly deteriorates accuracy of defect inspection. Moreover, there is a problem in that if the whole multi-detector needs to be replaced every time some pixels degrade, the cost of the multi-detector increases, and furthermore, the operating rate (utilization ratio) of the inspection apparatus falls. Thus, it is desirable to extend the life of the multi-detector. The problem described above may occur not only in the inspection apparatus but also in the apparatus which acquires images by using multiple beams.

BRIEF SUMMARY OF THE INVENTION

According to one aspect of the present invention, a multiple beam inspection apparatus includes a stage configured to mount thereon a target object on which a pattern is formed; a multiple-beam column configured to irradiate the target object with multiple primary electron beams; a multi-detector configured to detect multiple secondary electron beams generated due to that the target object is irradiated with the multiple primary electron beams, and to include a plurality of detection pixels each of which receives irradiation of a corresponding secondary electron beam in the multiple secondary electron beams, and the each of which has a region formed to be capable of receiving the irradiation of the corresponding secondary electron beam and to be larger than a size of an irradiation spot of the corresponding secondary electron beam; an inspection circuitry configured to inspect the pattern, using information on the multiple secondary electron beams detected by the multi-detector; a shifting mechanism configured to shift irradiation positions of the multiple secondary electron beams which irradiate the plurality of detection pixels; a degradation determination circuitry configured to determine whether sensitivity of at least one detection pixel in the plurality of detection pixels has been degraded; and a setting circuitry configured to, in a case where the sensitivity of the at least one detection pixel has been degraded, set shifting destinations of the irradiation positions of the multiple secondary electron beams which irradiate the plurality of detection pixels such that a shifting destination of an irradiation position of each of the multiple secondary electron beams is within each corresponding same detection pixel.

According to another aspect of the present invention, a sensitivity correction method for multi-detector includes detecting multiple secondary electron beams generated due to that an evaluation pattern is irradiated with multiple primary electron beams, by a multi-detector including a plurality of detection pixels each of which receives irradiation of a corresponding secondary electron beam in the multiple secondary electron beams, and the each of which has a region formed to be capable of receiving the irradiation of the corresponding secondary electron beam and to be larger than a size of an irradiation spot of the corresponding secondary electron beam; determining whether sensitivity of at least one detection pixel in the plurality of detection pixels has been degraded; shifting, in a case where the sensitivity of the at least one detection pixel has been degraded, irradiation positions of the multiple secondary electron beams, which irradiate the plurality of detection pixels, in respective corresponding detection pixels, and setting, in the case where the sensitivity of the at least one detection pixel has been degraded, shifting destinations of the irradiation positions of the multiple secondary electron beams which irradiate the plurality of detection pixels such that a shifting destination of an irradiation position of each of the multiple secondary electron beams is within each corresponding same detection pixel.

DETAILED DESCRIPTION OF THE INVENTION

Embodiments below describe an apparatus and method which can extend the life of a multi-detector used in the case of acquiring images by using multiple beams.

First Embodiment

Figure 1:
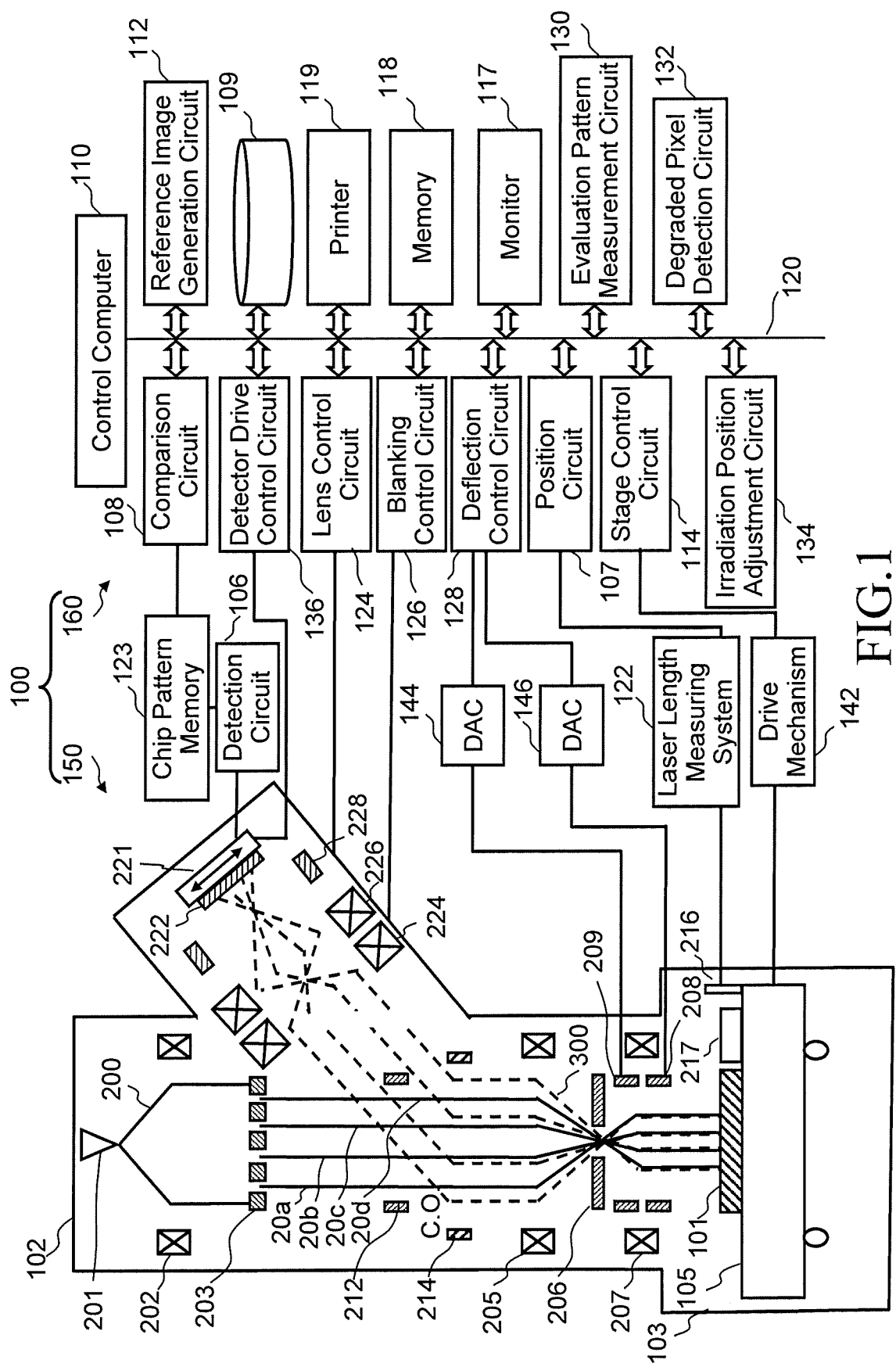
FIG. 1 shows a configuration of a pattern inspection apparatus according to a first embodiment.

FIG. 1 shows a configuration of a pattern inspection apparatus according to a first embodiment. In FIG. 1, an inspection apparatus 100 for inspecting patterns formed on the substrate is an example of an electron beam inspection apparatus. Moreover, the inspection apparatus 100 is an example of a multiple beam inspection apparatus. Further, the inspection apparatus 100 is an example of an electron beam image acquisition apparatus. Furthermore, the inspection apparatus 100 is an example of a multiple beam image acquisition apparatus. The inspection apparatus 100 includes an image acquisition mechanism 150 and a control system circuit 160. The image acquisition mechanism 150 includes an electron beam column 102 (also called an electron optical column) (example of multiple-beam column), an inspection chamber 103, a detection circuit 106, a chip pattern memory 123, a stage drive mechanism 142, and a laser length measuring system 122. In the electron beam column 102, there are disposed an electron gun 201, an illumination lens 202, a shaping aperture array substrate 203, a reducing lens 205, a limiting aperture substrate 206, an objective lens 207, a main deflector 208, a sub deflector 209, a common blanking deflector 212, a beam separator 214, projection lenses 224 and 226, a deflector 228, and a multi-detector 222. The multi-detector 222 is disposed on a detection stage 221 to be two-dimensionally movable by the movement (shift) of the detection stage 221.

In the inspection chamber 103, there is arranged an XY stage 105 movable at least in the x-y plane. On the XY stage 105, there is placed a substrate 101 (target object) to be inspected. The substrate 101 may be an exposure mask substrate, or a semiconductor substrate such as a silicon wafer. When the substrate 101 is a semiconductor substrate, a plurality of chip patterns (wafer die) is formed on the semiconductor substrate. When the substrate 101 is an exposure mask substrate, a chip pattern is formed on the exposure mask substrate. The chip pattern is composed of a plurality of figure patterns. If a chip pattern formed on the exposure mask substrate is exposed (transferred) onto the semiconductor substrate a plurality of times, a plurality of chip patterns (wafer die) is formed on the semiconductor substrate. Hereinafter, the case of the substrate 101 being a semiconductor substrate is mainly described below. The substrate 101 is placed with its pattern forming surface facing upward, on the XY stage 105, for example. Moreover, on the XY stage 105, there is disposed a mirror 216 which reflects a laser beam for measuring a laser length emitted from the laser length measuring system 122 disposed outside the inspection chamber 103. Moreover, on the XY stage 105, there is arranged an evaluation mark 217 on which an evaluation pattern to be described later is formed. The height position of the surface of the evaluation mark 217 is substantially flush in height to the surface of the substrate 101. The multi-detector 222 is connected, at the outside of the electron beam column 102, to the detection circuit 106. The detection circuit 106 is connected to the chip pattern memory 123.

In the control system circuit 160, a control computer 110 which controls the whole of the inspection apparatus 100 is connected, through a bus 120, to a position circuit 107, a comparison circuit 108, a reference image generation circuit 112, a stage control circuit 114, a lens control circuit 124, a blanking control circuit 126, a deflection control circuit 128, an evaluation pattern measurement circuit 130, a degraded pixel detection circuit 132, an irradiation position adjustment circuit 134, a detector drive control circuit 136, a storage device 109 such as a magnetic disk drive, a monitor 117, a memory 118, and a printer 119. Moreover, the deflection control circuit 128 is connected to DAC (digital-to-analog conversion) amplifiers 144 and 146. The DAC amplifier 146 is connected to the main deflector 208, and the DAC amplifier 144 is connected to the sub deflector 209.

The chip pattern memory 123 is connected to the comparison circuit 108. The XY stage 105 is driven by the drive mechanism 142 under the control of the stage control circuit 114. In the drive mechanism 142, the XY stage 105 can be moved by a drive system, such as a three (x-, y-, and θ-) axis motor, for example, which moves in the directions of x, y, and θ in the stage coordinate system. For example, a step motor can be used as each of these X, Y, and θ motors (not shown). The XY stage 105 is movable in the horizontal direction and the rotation direction by the motors of the X-axis, Y-axis, and θ-axis. The movement position of the XY stage 105 is measured by the laser length measuring system 122, and supplied (transmitted) to the position circuit 107. Based on the principle of laser interferometry, the laser length measuring system 122 measures the position of the XY stage 105 by receiving a reflected light from the mirror 216. In the stage coordinate system, the X, Y, and θ directions are set with respect to a plane orthogonal to the optical axis of the multiple primary electron beams, for example.

Moreover, the detection stage 221 is driven by a drive mechanism (not shown) under the control of the detector drive control circuit 136. For example, a drive system such as a three (x-, y-, and θ-) axis motor which moves in the directions of x, y, and θ in a secondary electron detection coordinate system is configured so as to make the detection stage 221 movable. In the secondary electron detection coordinate system, the X, Y, and θ directions are set with respect to a plane orthogonal to the optical axis of the multiple secondary electron beams, for example.

To the electron gun 201, there is connected a high voltage power supply circuit (not shown). The high voltage power supply circuit applies an acceleration voltage between the filament and the extraction electrode (anode) (which are not shown) in the electron gun 201. In addition to applying the acceleration voltage as described above, by applying a voltage to the extraction electrode (Wehnelt) and heating the cathode at a predetermined temperature, electrons emitted from the cathode are accelerated and emitted as an electron beam 200. For example, electromagnetic lenses are used as the illumination lens 202, the reducing lens 205, the objective lens 207, and the projection lenses 224 and 226, and all of them are controlled by the lens control circuit 124. The beam separator 214 is also controlled by the lens control circuit 124. Each of the common blanking deflector 212 and the deflector 228 is composed of electrodes of at least two poles, and controlled by the blanking control circuit 126. The main deflector 208 is composed of electrodes of at least four poles, and controlled by the deflection control circuit 128 through the DAC amplifier 146 disposed for each electrode. The sub deflector 209 is composed of electrodes of at least four poles, and controlled by the deflection control circuit 128 through the DAC amplifier 144 disposed for each electrode.

FIG. 1 shows configuration elements necessary for describing the first embodiment. It should be understood that other configuration elements generally necessary for the inspection apparatus 100 may also be included therein.

Figure 2:
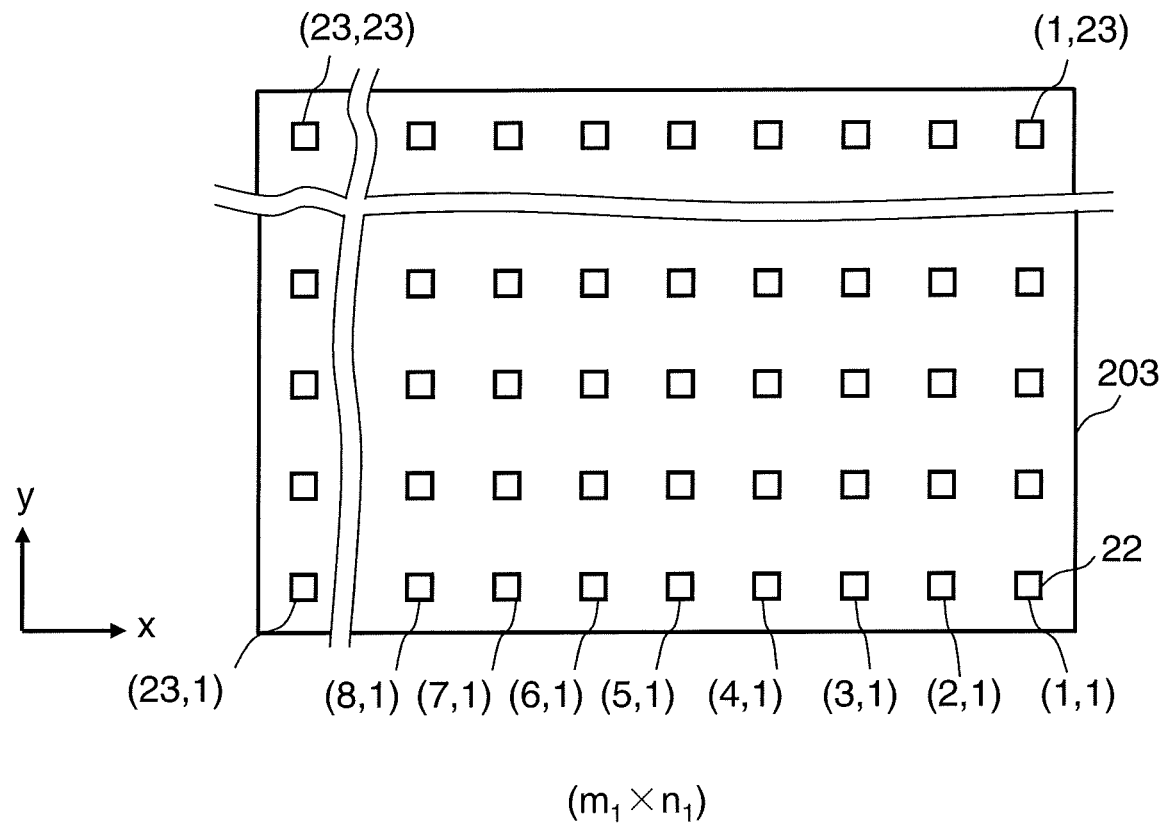
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of $m_1$ columns wide (x direction) and $n_1$ rows long (y direction) are two-dimensionally formed at a predetermined arrangement pitch in the shaping aperture array substrate 203, where $m_1$ and $n_1$ are integers of 2 or greater. In the case of FIG. 2, holes 22 of 23 (columns in x direction)×23 (rows in y direction) are formed. Each of the holes 22 is a quadrangle (rectangle) having the same dimension, shape, and size. Alternatively, each of the holes 22 may be a circle with the same outer diameter. The multiple beams 20 are formed by letting portions of the electron beam 200 individually pass through a corresponding one of a plurality of holes 22. Here, the case in which the holes 22 of two or more rows and columns are arranged in both the x and y directions is shown, but the arrangement is not limited thereto. For example, it is also acceptable that a plurality of holes 22 are arranged in only one row (x direction) or in only one column (y direction). That is, in the case of only one row, a plurality of holes 22 are arranged in the x direction as a plurality of columns, and in the case of only one column, a plurality of holes 22 are arranged in the y direction as a plurality of rows. The method of arranging the holes 22 is not limited to the case of FIG. 2 where holes are arranged like a grid in the width and length directions. For example, with respect to the k-th and the (k+1)th rows which are arrayed in the length direction (y direction) and each of which is in the x direction, each hole in the k-th row and each hole in the (k+1)th row may be mutually displaced in the width direction (x direction) by a dimension "a". Similarly, with respect to the (k+1)th and the (k+2)th rows which are arrayed in the length direction (y direction) and each of which is in the x direction, each hole in the (k+1)th row and each hole in the (k+2)th row may be mutually displaced in the width direction (x direction) by a dimension "b".

Using the multiple beams 20 each being an electron beam, the image acquisition mechanism 150 acquires an image of a figure pattern, to be inspected, from the substrate 101 on which figure patterns are formed. Hereinafter, operations of the image acquisition mechanism 150 in the inspection apparatus 100 are described.

The electron beam 200 emitted from the electron gun 201 (emission source) almost perpendicularly (e.g., vertically) illuminates the whole of the shaping aperture array substrate 203 by the illumination lens 202. As shown in FIG. 2, a plurality of quadrangular (rectangular) holes 22 (openings) are formed in the shaping aperture array substrate 203. The region including all the plurality of holes 22 is irradiated by the electron beam 200. For example, a plurality of quadrangular electron beams (multiple beams) 20a to 20d (solid lines in FIG. 1) (multiple primary electron beams) are formed by making portions of the electron beam 200, which irradiate the positions of a plurality of holes 22, individually pass through a corresponding one of the plurality of holes 22 in the shaping aperture array substrate 203.

Then, the multiple beams 20a to 20d form a crossover (C.O.). After having passed through the beam separator 214 disposed at the crossover position of each beam of the multiple beams 20, the multiple beams 20a to 20d are reduced by the reducing lens 205, and travel toward the center hole of the limiting aperture substrate 206. At this stage, when being collectively deflected by the common blanking deflector 212 placed between the shaping aperture array substrate 203 and the reducing lens 205, the multiple beams 20a to 20d deviate from the center hole of the limiting aperture substrate 206 so as to be blocked by the limiting aperture substrate 206. On the other hand, the multiple beams 20a to 20d which were not deflected by the common blanking deflector 212 pass through the center hole of the limiting aperture substrate 206 as shown in FIG. 1. Blanking control is provided by ON/OFF of the common blanking deflector 212 to collectively control ON/OFF of the beams. Thus, the limiting aperture substrate 206 blocks the multiple beams 20a to 20d which were deflected to be in the OFF condition by the common blanking deflector 212. Then, the multiple beams 20a to 20d for inspection are formed by the beams having been made during a period from becoming "beam ON" to becoming "beam OFF" and having passed through the limiting aperture substrate 206. The multiple beams 20a to 20d having passed through the limiting aperture substrate 206 are focused on the substrate 101 by the objective lens 207 to be a pattern image (beam diameter) of a desired reduction ratio. Then, the whole multiple beams 20 having passed through the limiting aperture substrate 206 are collectively deflected in the same direction by the main deflector 208 and the sub deflector 209 in order to irradiate respective beam irradiation positions on the substrate 101. In such a case, the main deflector 208 collectively deflects all of the multiple beams 20 to the reference position of the mask die to be scanned by the multiple beams 20. According to the first embodiment, scanning is performed while continuously moving the XY stage 105, for example. Therefore, the main deflector 208 performs tracking deflection to follow the movement of the XY stage 105. Then, the sub deflector 209 collectively deflects all of the multiple beams 20 so that each beam may scan a corresponding region. Ideally, the multiple beams 20 irradiating at a time are aligned at the pitch obtained by multiplying the arrangement pitch of a plurality of holes 22 in the shaping aperture array substrate 203 by the desired reduction ratio (1/a) described above. Thus, the electron beam column 102 irradiates the substrate 101 with two-dimensional $m_1 \times n_1$ multiple beams 20 at a time. A flux of secondary electrons (multiple secondary electron beams 300) (dotted lines in FIG. 1) including reflected electrons, corresponding to each beam of the multiple beams 20, is emitted from the substrate 101 due to that desired positions on the substrate 101 are irradiated with the multiple beams 20.

The multiple secondary electron beams 300 emitted from the substrate 101 are refracted toward the center of the multiple secondary electron beams 300 by the objective lens 207, and travel toward the center hole of the limiting aperture substrate 206. The multiple secondary electron beams 300 having passed through the limiting aperture substrate 206 are refracted almost parallel to the optical axis by the reducing lens 205, and travel to the beam separator 214.

The beam separator 214 generates an electric field and a magnetic field to be orthogonal to each other in a plane orthogonal to the traveling direction (optical axis) of the multiple beams 20. The electric field exerts a force in a fixed direction regardless of the traveling direction of electrons. In contrast, the magnetic field exerts a force according to Fleming's left-hand rule. Therefore, the direction of force acting on electrons can be changed depending on the entering direction of an electron. With respect to the multiple beams 20 (primary electron beams) entering the beam separator 214 from the upper side, since the force due to the electric field and the force due to the magnetic field cancel each other out, the multiple beams 20 travel straight downward. On the other hand, with respect to the multiple secondary electron beams 300 entering the beam separator 214 from the lower side, since both the force due to the electric field and the force due to the magnetic field are exerted in the same direction, the multiple secondary electron beams 300 are bent obliquely upward.

The multiple secondary electron beams 300 bent obliquely upward are projected onto the multi-detector 222 while being refracted by the projection lenses 224 and 226. The multi-detector 222 detects the projected multiple secondary electron beams 300. The multi-detector 222 includes a diode type two-dimensional sensor (not shown), for example. Then, at the position of the diode type two-dimensional sensor corresponding to each beam of the multiple beams 20, each secondary electron of the multiple secondary electron beams 300 collides with the diode type two-dimensional sensor to produce an electron, and generate secondary electron image data for each pixel to be described later. Since scanning is performed while continuously moving the XY stage 105, tracking deflection is provided as described above. Being coincident with the movement of the deflection position along with the tracking deflection, the deflector 228 deflects the multiple secondary electron beams 300 so that they may irradiate respective desired positions on the light receiving surface of the multi-detector 222.

Figure 3:
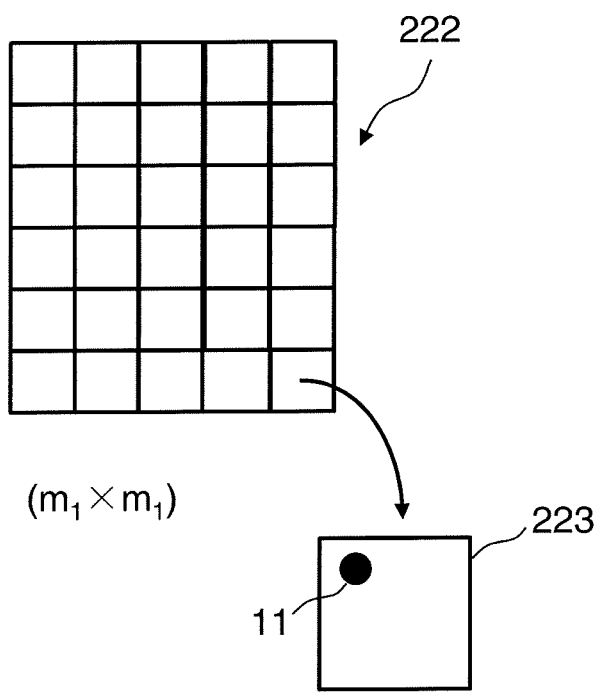
FIG. 3 illustrates a configuration of a multi-detector, and a secondary electron beam irradiating the multi-detector according to the first embodiment.

FIG. 3 illustrates a configuration of a multi-detector, and a secondary electron beam irradiating the multi-detector according to the first embodiment. In FIG. 3, the multi-detector 222 includes a plurality of detection pixels 223. The multi-detector 222 detects the multiple secondary electron beams 300 by using a plurality of detection pixels 223. Each of a plurality of detection pixels 223 is irradiated with a corresponding secondary electron beam 11 in the multiple secondary electron beams 300 generated due to that the substrate 101 is irradiated with the multiple beams 20. As shown in FIG. 3, each of a plurality of detection pixels 223 is formed such that the light-receiving region to receive irradiation with the secondary electron beam 11 is larger than the irradiation spot size of the secondary electron beam 11. For example, preferably, the diameter of the irradiation spot of each secondary electron beam 11 of the multiple secondary electron beams 300 is 200 to 300 μm whereas the size of the light-receiving region of each detection pixel 223 is a square of 1 to 2 mm. Therefore, when receiving irradiation with the corresponding secondary electron beam 300, only a portion of the light-receiving region of each detection pixel 223 is used. In the multi-detector 222, detection sensitivity of each detection pixel 223 is degraded due to that a plurality of detection pixels 223 are continuously irradiated with the multiple secondary electron beams 300. The degradation of the detection pixel 223 individually occurs in a plurality of detection pixels 223. Therefore, if the detection sensitivity degrades in any one of pixels, it becomes necessary to correct a measured image by using information on surrounding pixels, or to replace the multi-detector itself. When the number of the detection pixels 223 is equivalent to the number of the multiple secondary electron beams 300, in the case of correction using information on surrounding pixels, information per beam is large against pattern dimension accuracy needed for inspection. Accordingly, lack of information from a pixel with degraded sensitivity greatly deteriorates the accuracy of defect inspection. Moreover, if the whole multi-detector 222 needs to be replaced every time some pixels degrade, not only that the cost of the multi-detector 222 increases but also the operating rate (utilization ratio) of the inspection apparatus 100 falls. Then, according to the first embodiment, the life of the multi-detector 222 is extended as described below.

Figure 4:
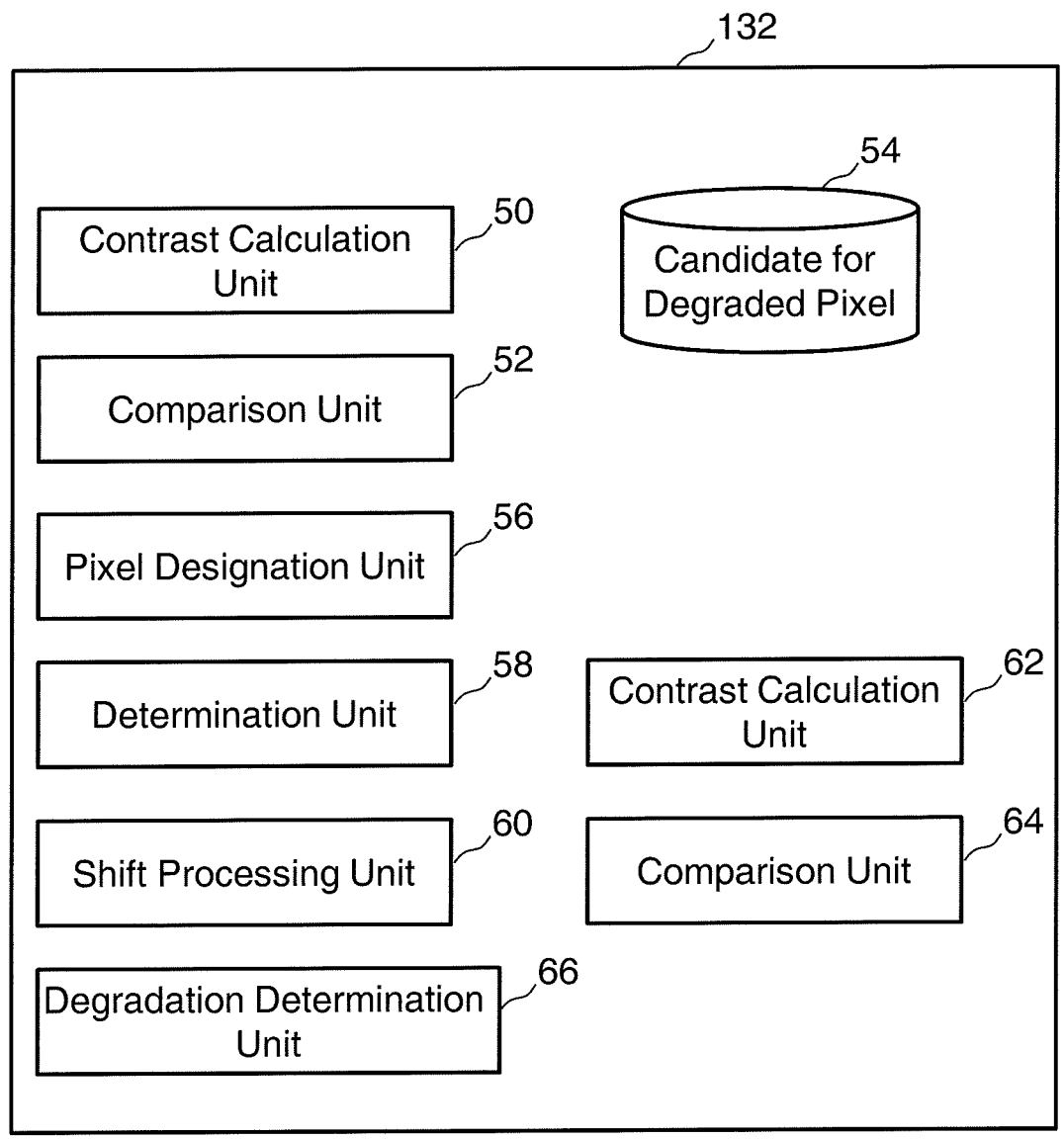
FIG. 4 is a block diagram showing an example of an internal structure of a degraded pixel detection circuit according to the first embodiment.

FIG. 4 is a block diagram showing an example of an internal structure of a degraded pixel detection circuit according to the first embodiment. As shown in FIG. 4, in the degraded pixel detection circuit 132, there are arranged a storage device 54 such as a magnetic disk drive, a contrast calculation unit 50, a comparison unit 52, a pixel designation unit 56, a determination unit 58, a shift unit 60, a contrast calculation unit 62, a comparison unit 64, and a degradation determination unit 66. Each of the "units" such as the contrast calculation unit 50, the comparison unit 52, the pixel designation unit 56, the determination unit 58, the shift unit 60, the contrast calculation unit 62, the comparison unit 64, and the degradation determination unit 66 includes a processing circuitry. As the processing circuitry, for example, an electric circuit, computer, processor, circuit board, quantum circuit, semiconductor device, or the like can be used. Each of the "units" may use a common processing circuitry (same processing circuitry), or different processing circuitries (separate processing circuitries). Input data required in the contrast calculation unit 50, the comparison unit 52, the pixel designation unit 56, the determination unit 58, the shift unit 60, the contrast calculation unit 62, the comparison unit 64, and the degradation determination unit 66, and calculated results are stored in a memory (not shown) each time.

Figure 5:
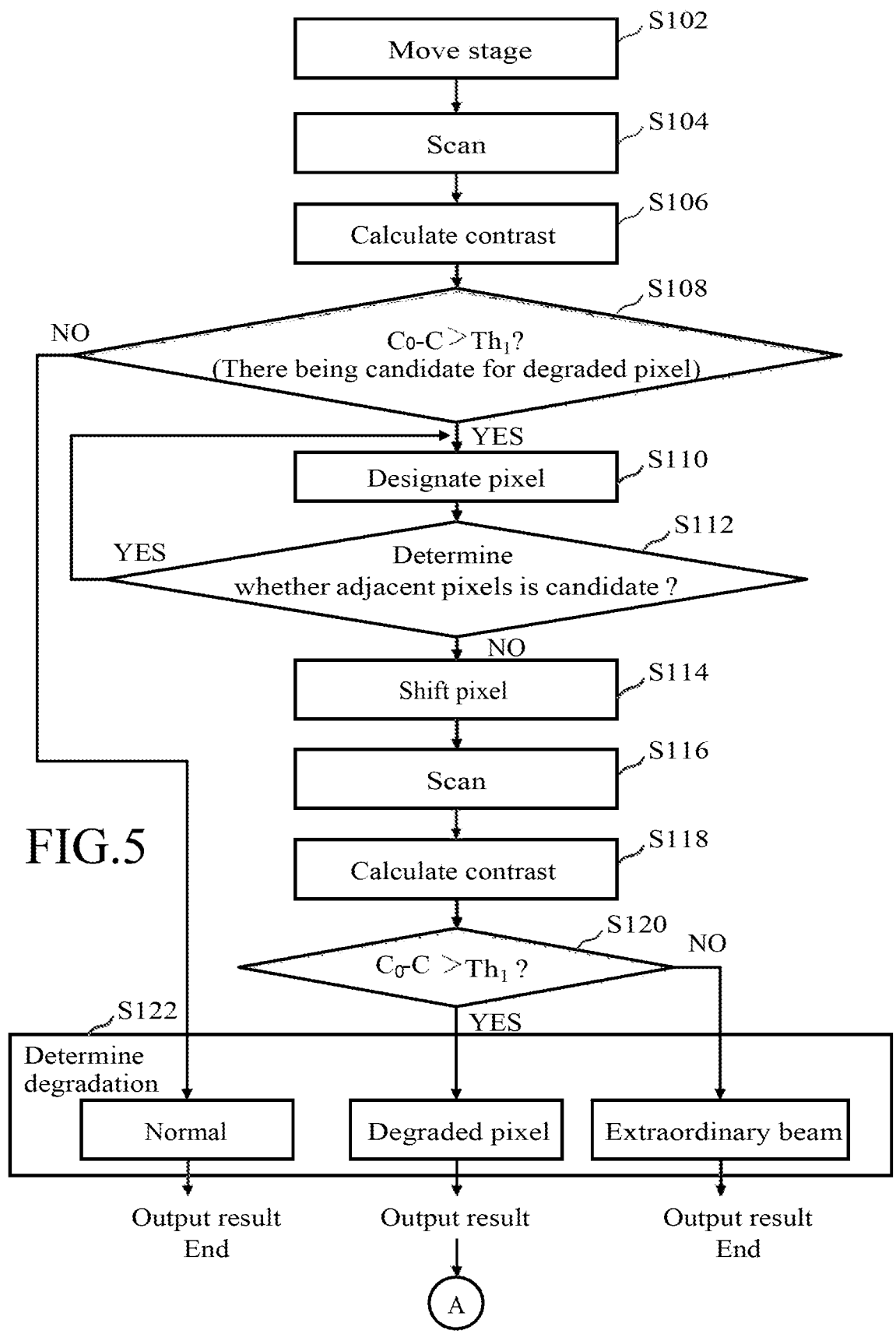
FIG. 5 is a flowchart showing a part of main steps of a sensitivity correction method of a multi-detector according to the first embodiment.

FIG. 5 is a flowchart showing a part of main steps of a sensitivity correction method of a multi-detector according to the first embodiment. In FIG. 5, a part of the sensitivity correction method of the multi-detector of the first embodiment executes a series of steps: a stage moving step (S102), a scanning step (S104), a contrast calculating step (S106), a determining step (S108), a pixel designating step (S110), a determining step (S112), a pixel shifting step (S114), a scanning step (S116), a contrast calculating step (S118), a determining step (S120), and a degradation determining step (S122). As a part of a sensitivity correction method of a multi-detector according to the first embodiment, the example of FIG. 5 shows a method for determining whether there is a detection pixel (degraded pixel) with degraded sensitivity in a plurality of detection pixels 223 of the multi-detector 222, in other words, a detection method for a degraded pixel.

In the stage moving step (S102), under the control of the evaluation pattern measurement circuit 130, the stage control circuit 114 moves the XY stage 105 so that the evaluation mark 217 on the XY stage 105 may be in the irradiation region of the multiple beams 20.

In the scanning step (S104), under the control of the evaluation pattern measurement circuit 130, the image acquisition mechanism 150 scans an evaluation pattern formed on the evaluation mark 217 with the multiple beams 20. Then, the multi-detector 222 detects the multiple secondary electron beams 300 obtained by scanning the evaluation pattern with the multiple beams 20.

Figure 6:
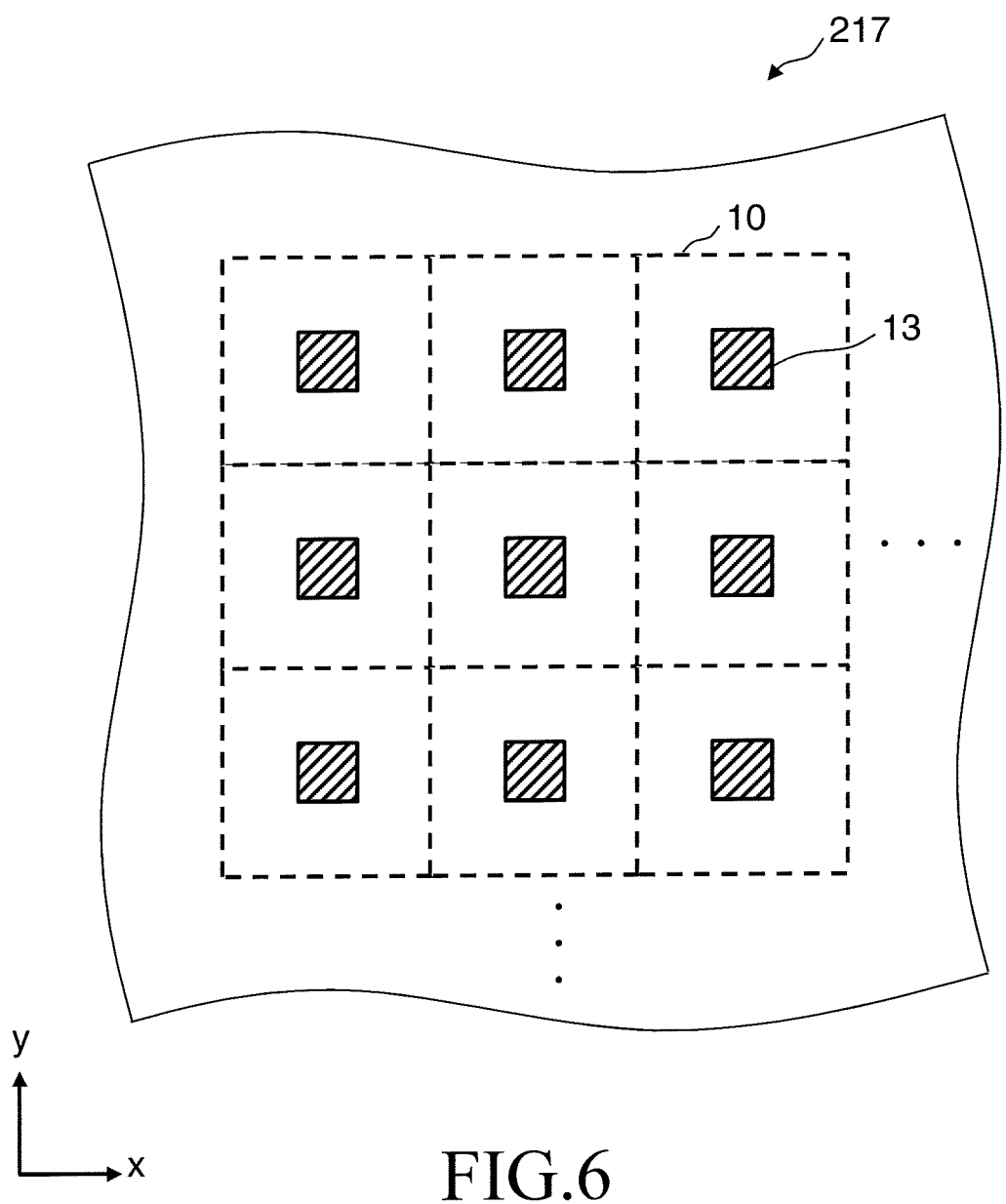
FIG. 6 shows an example of an evaluation pattern according to the first embodiment.

FIG. 6 shows an example of an evaluation pattern according to the first embodiment. As shown in FIG. 6, in the evaluation mark 217, a plurality of rectangular (including square) figure patterns 13 whose number is greater than the number of beams of the multiple beams 20 are formed in the array pitch on the substrate 101 of the multiple beams 20. In FIG. 6, one section 10 in a dotted line represents a scanning range of each primary electron beam, and each figure pattern 13 is formed smaller in the x and y directions than the scanning range of a corresponding primary electron beam. A secondary electron beam from each section 10 enters a corresponding detection pixel 223 of the multi-detector 222. When each primary electron beam of the multiple beams 20 scans a corresponding figure pattern 13, the shape of the pattern 13 is recognized as an image reconstructed from the information acquired in time series in each detection pixel 223. In the example of FIG. 6, a plurality of figure patterns 13 are arranged in the array pitch on the substrate 101 of the multiple beams 20 such that not a plurality of figure patterns 13 but one figure pattern 13 is detected in each detection pixel 223 by one scanning operation. Then, the image acquisition mechanism 150 captures an evaluation pattern in the irradiation region of the multiple beams 20 by deflecting the multiple beams 20 onto the evaluation pattern using the main deflector 208 controlled by the deflection control circuit 128, and scans the figure pattern 13 corresponding to each primary electron beam of the multiple beams 20 while collectively deflecting the whole multiple beams 20 by the sub deflector 209 controlled by the deflection control circuit 128.

Then, the multi-detector 222 detects the multiple secondary electron beams 300 emitted from the evaluation mark 217 by irradiation with the multiple beams 20. Detected data is output to the detection circuit 106 in order of measurement. In the detection circuit 106, the detected data in analog form is converted to digital data by an A-D converter (not shown) to be stored in the chip pattern memory 123. A secondary electron image detected by each detection pixel 223 serves as a measured image of the corresponding figure pattern 13. Thereby, the image acquisition mechanism 150 acquires the measured image of the evaluation pattern formed on the evaluation mark 217.

In the contrast calculating step (S106), the contrast calculation unit 50 (first contrast calculation unit) calculates a contrast of a secondary electron beam image for each of a plurality of detection pixels 223, based on a detection result obtained when detecting, by the multi-detector 222, the multiple secondary electron beams 300 obtained by scanning the evaluation pattern with the multiple beams 20. Specifically, the value of contrast between the figure pattern 13 and the surrounding portion of the figure pattern 13 is calculated from the secondary electron image of the corresponding figure pattern 13 detected by each detection pixel 223. For example, the difference value between detected intensities is calculated.

In the determining step (S108), the comparison unit 52 (first comparison unit) compares, for each detection pixel 223, the calculated contrast value and the value of the reference contrast acquired in advance, and then, based on the comparison result, determines whether there is a candidate for a degradation detection pixel having a possibility of sensitivity degraded. With respect to the reference contrast, a secondary electron image of the evaluation pattern described above is detected at the time of or before mounting the multi-detector 222 in the inspection apparatus 100, and then, based on the detection result, the reference contrast of a secondary electron beam image is calculated for each of a plurality of detection pixels 223. In the case of acquiring a reference contrast before mounting the multi-detector 222, it is sufficient to attach the multi-detector 222 to the inspection apparatus for evaluation or the image acquisition apparatus so as to obtain the reference contrast by experiment. By comparing with the reference contrast, the detection sensitivity of the current detection pixel 223 can be evaluated. Here, it is determined whether there is the detection pixel 223 to be a candidate for a degradation detection pixel whose difference value (C−C0) between the calculated contrast C and the reference contrast C0 is greater than a threshold Th1. When there is no detection pixel 223 whose difference value (C−C0) between the calculated contrast C and the reference contrast C0 is greater than the threshold Th1, it goes to the degradation determining step (S122). When there is at least one detection pixel 223 whose difference value (C−C0) between the calculated contrast C and the reference contrast C0 is greater than the threshold Th1, it goes to the pixel designating step (S110). Information on a candidate for a degradation detection pixel is stored in the storage device 54.

In the pixel designating step (S110), the pixel designation unit 56 specifies an adjacent detection pixel which is adjacent to the detection pixel 223 serving as a candidate for a degradation detection pixel. When a plurality of detection pixels 223 are included in candidates for a degradation detection pixel, adjacent detection pixels adjoining in the same direction with respect to respective candidates for a degradation detection pixel are designated. For example, adjacent detection pixels adjoining in the x direction are designated.

In the determining step (S112), the determination unit 58 determines whether a designated adjacent detection pixel is a candidate for a degradation detection pixel or not. When a plurality of detection pixels 223 are included in candidates for a degradation detection pixel, it is similarly determined, for each candidate for a degradation detection pixel, whether the designated adjacent detection pixel is a candidate for a degradation detection pixel or not. When at least even one of adjacent detection pixels of all the candidates for a degradation detection pixel is a candidate for a degradation detection pixel, it returns to the pixel designating step (S110). When no adjacent detection pixels of all the candidates for a degradation detection pixel are candidates for a degradation detection pixel, it goes to the pixel shifting step (S114).

When at least even one of adjacent detection pixels of all the candidates for a degradation detection pixel is a candidate for a degradation detection pixel, it returns to the pixel designating step (S110), and the steps from the pixel designating step (S110) to the determining step (S112) are repeated until it is determined in the determining step (S112) that no adjacent detection pixels of all the candidates for a degradation detection pixel are candidates for a degradation detection pixel. In such a case, at the pixel designating step (S110), an adjacent detection pixel adjoining in a direction different from the previous designated adjacent direction is designated. However, for example, when any one of adjacent detection pixels is a candidate for a degradation detection pixel even if having designated with respect to all the eight directions centering the candidate for a degradation detection pixel, an error indication representing such a state is made so as to result in the end. Alternatively, it is also sufficient to designate a next but one adjacent detection pixel in order in the eight directions centering the candidate for a degradation detection pixel. Even so, when any one of adjacent detection pixels is a candidate for a degradation detection pixel, it is also sufficient to expand the designation range, such as a next but two adjacent detection pixel, a next but three adjacent detection pixel, and so on. In such a case, at the time of there being no adjacent detection pixel to designate, an error indication representing such a state is made so as to result in the end. Alternatively, it is also preferable to perform determination at each time of finding a normal adjacent detection pixel for each candidate for a degradation detection pixel. Although the former method has an advantage of being able to perform determination with respect to all the candidates for a degradation detection pixels through one shifting process, since combination has restriction, the detection may take time. On the other hand, since the latter method performs detection and determination for each candidate for a degradation detection pixel, although it may be thought to be inefficient apparently, the detection time may be reduced as a total.

In the pixel shifting step (S114), when there is a candidate for a degradation detection pixel, the shift unit 60 shifts the detection pixel 223 to be irradiated with each secondary electron beam of the multiple secondary electron beams 300. In that case, shifting is performed so that secondary electron beams which irradiated the candidates for a degradation detection pixel may irradiate the adjacent detection pixels in the case of having determined that adjacent detection pixels of all the candidates for a degradation detection pixel are not candidates for a degradation detection pixel.

Figure 7:
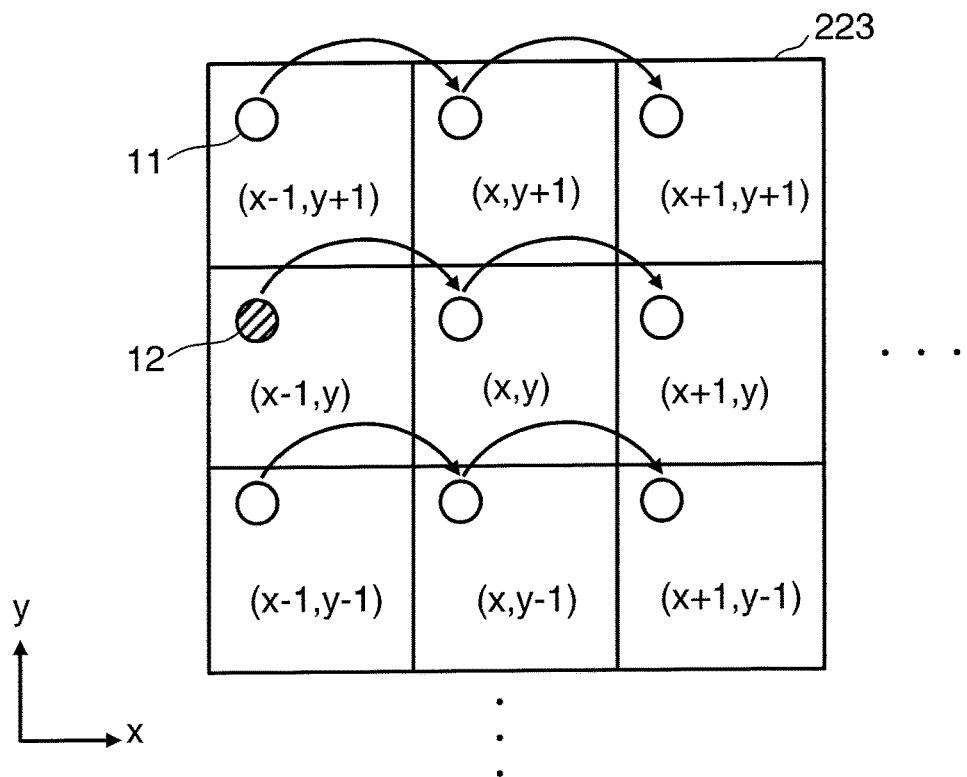
FIG. 7 illustrates a method for shifting a pixel according to the first embodiment.

FIG. 7 illustrates a method for shifting a pixel according to the first embodiment. FIG. 7 shows the case where the detection pixel 223 of coordinates (x−1, y) is a candidate for a degradation detection pixel. For example, when it is determined that the adjacent detection pixel adjoining in the x direction is not a candidate for a degradation detection pixel, the detection pixel 223 to be irradiated with each secondary electron beam of the multiple secondary electron beams 300 is shifted to the adjacent detection pixel 223 adjoining in the x direction. Specifically, the shift unit 60 outputs a control signal for moving the detection stage 221, to the detector drive control circuit 136. Then, the detector drive control circuit 136 mechanically shifts the arrangement positions of a plurality of detection pixels 223 corresponding to the multiple secondary electron beams 300 by moving the detection stage 221 (example of shifting unit or shifting mechanism). Alternatively, the shift unit 60 outputs a control signal for moving the deflection position of the deflector 228, to the deflection control circuit 128. Then, the deflection control circuit 128 may electromagnetically shift the irradiation positions of the multiple secondary electron beams 300, which irradiate a plurality of detection pixels 223, by moving the deflection position of the deflector 228 (another example of shifting unit or shifting mechanism). In either case, shifting is performed such that the detection pixel 223 to be irradiated with each secondary electron beam 11 is switched (shifted) to another detection pixels 223. Consequently, as shown in FIG. 7, the irradiation position of the secondary electron beam 12 having irradiated the detection pixel 223 of coordinates (x−1, y) is shifted so as to irradiate the detection pixel 223 of coordinates (x, y). Since the multiple secondary electron beams 300 are collectively shifted, for example, the irradiation position of the secondary electron beam 11 having irradiated the detection pixel 223 of coordinates (x−1, y+1) is shifted so as to irradiate the detection pixel 223 of coordinates (x, y+1). Similarly, the irradiation position of the secondary electron beam 11 having irradiated the detection pixel 223 of coordinates (x, y+1) is shifted so as to irradiate the detection pixel 223 of coordinates (x+1, y+1). Similarly, the irradiation position of the secondary electron beam 11 having irradiated the detection pixel 223 of coordinates (x, y) is shifted so as to irradiate the detection pixel 223 of coordinates (x+1, y). Similarly, the irradiation position of the secondary electron beam 11 having irradiated the detection pixel 223 of coordinates (x−1, y−1) is shifted so as to irradiate the detection pixel 223 of coordinates (x, y−1). Similarly, the irradiation position of the secondary electron beam 11 having irradiated the detection pixel 223 of coordinates (x, y−1) is shifted so as to irradiate the detection pixel 223 of coordinates (x+1, y−1). Although, due to the collective shifting of the multiple secondary electron beams 300, the detection pixels 223 in one row in a plurality of detection pixels 223 of the multi-detector 222 are not irradiated with the secondary electron beams 11, since this process is just for detecting a degraded pixel, no influence is given to image acquisition of the substrate 101 to be inspected.

In the scanning step (S116), under the control the evaluation pattern measurement circuit 130, the image acquisition mechanism 150 scans the evaluation pattern with the multiple beams 20. Then, the multi-detector 222 detects the multiple secondary electron beams 300 obtained by scanning the evaluation pattern with the multiple beams 20.

Then, the multi-detector 222 detects the multiple secondary electron beams 300 emitted from the evaluation mark 217 by irradiation with the multiple beams 20. Detected data is output to the detection circuit 106 in order of measurement. In the detection circuit 106, the detected data in analog form is converted to digital data by an A-D converter (not shown) to be stored in the chip pattern memory 123. A secondary electron image detected by each detection pixel 223 serves as a measured image of the corresponding figure pattern 13. Thereby, the image acquisition mechanism 150 acquires the measured image of the evaluation pattern formed on the evaluation mark 217. Here, the detection pixel 223 of the multi-detector 222 irradiated with the each secondary electron beam 11 of the multiple secondary electron beams 300 emitted by irradiation with the multiple beams 20 is shifted by at least one pixel. Therefore, the candidate for a degradation detection pixel described above is irradiated with the secondary electron beam 11 which is different from the one used for irradiation in the scanning step (S104).

In the contrast calculating step (S118), in the state where the detection pixel 223 has been shifted, with respect to a candidate for a degradation detection pixel, the contrast calculation unit 62 (second contrast calculation unit) calculates a contrast of a secondary electron beam image from a detection result of the candidate for a degradation detection pixel in the case of detecting, by the multi-detector 222, the multiple secondary electron beams 300 obtained by scanning the evaluation pattern with the multiple beams 20. Specifically, the value of contrast between the figure pattern 13 and the surrounding portion of the figure pattern 13 is calculated from the secondary electron image of the corresponding figure pattern 13 detected by each detection pixel 223 served as the candidate for a degradation detection pixel. For example, the difference value between detected intensities is calculated.

In the determining step (S120), with respect to the candidate for a degradation detection pixel, the comparison unit 64 (second comparison unit) compares the calculated contrast with the reference contrast acquired beforehand. The reference contrast is what has been described above. Here, it is determined whether the difference value (C−C0) between the contrast C calculated for the candidate for a degradation detection pixel and the reference contrast C0 of the candidate for a degradation detection pixel concerned is greater than the threshold Th1.

In the degradation determining step (S122), the degradation determination unit 66 determines whether the sensitivity of at least one detection pixel in a plurality of detection pixels 223 has been degraded. Here, based on a comparison result with respect to the candidate for a degradation detection pixel obtained in the state where the detection pixel 223 has been shifted, the degradation determination unit 66 determines whether the sensitivity of the candidate for a degradation detection pixel has been degraded. First, in the determining step (S120), when the difference value (C−C0) between the contrast C calculated for the candidate for a degradation detection pixel and the reference contrast C0 is greater than the threshold Th1, the degradation determination unit 66 determines that the sensitivity of the detection pixel 223 of the candidate for a degradation detection pixel concerned has been degraded. Since this is the case where the contrast C deviates from the reference contrast C0 even if the secondary electron beam 11 to irradiate is switched (shifted), it can be determined that the sensitivity of the detection pixel 223 of the candidate for a degradation detection pixel concerned has been degraded.

On the other hand, in the determining step (S120), when the difference value (C−C0) between the contrast C calculated for the candidate for a degradation detection pixel and the reference contrast C0 is not greater than the threshold Th1, the degradation determination unit 66 determines that the sensitivity of the detection pixel 223 of the candidate for a degradation detection pixel concerned is not degraded, but that the secondary electron beam 11 used for irradiation in the scanning step (S104) is an extraordinary beam. Then, a warning representing such a state is output, and detecting a degraded pixel is ended.

When, in the determining step (S108), there is no detection pixel 223 whose difference value (C−C0) between the calculated contrast C and the reference contrast C0 is greater than the threshold Th1, the degradation determination unit 66 determines that sensitivities of all the detection pixels 223 are excellent. Then, the determination result is output, and detecting a degraded pixel is ended.

As described above, the degraded pixel detection circuit 132 detects a degraded pixel in a plurality of detection pixels 223. Then, information on a degraded pixel which has been detected and determined that its detection sensitivity is degraded is output to the irradiation position adjustment circuit 134.

Figure 8:
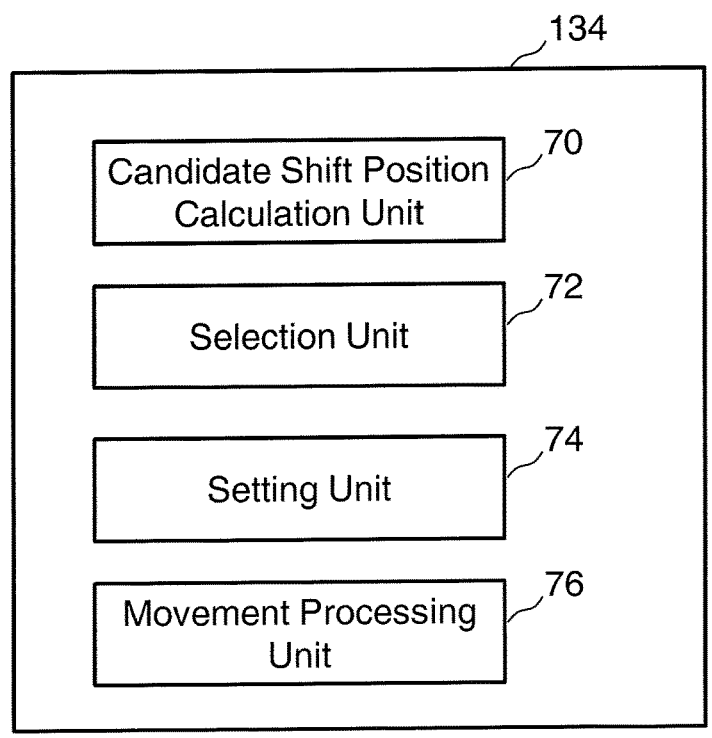
FIG. 8 is a block diagram showing an example of an internal structure of an irradiation position adjustment circuit according to the first embodiment.

FIG. 8 is a block diagram showing an example of an internal structure of an irradiation position adjustment circuit according to the first embodiment. As shown in FIG. 8, in the irradiation position adjustment circuit 134 of the first embodiment, there are arranged a candidate shift position calculation unit 70, a selection unit 72, a setting unit 74, and a movement processing unit 76. Each of the "units" such as the candidate shift position calculation unit 70, the selection unit 72, the setting unit 74, and the movement processing unit 76 includes a processing circuitry. As the processing circuitry, for example, an electric circuit, computer, processor, circuit board, quantum circuit, semiconductor device, or the like can be used. Each of the "units" may use a common processing circuitry (same processing circuitry), or different processing circuitries (separate processing circuitries). Input data required in the candidate shift position calculation unit 70, the selection unit 72, the setting unit 74, and the movement processing unit 76, and calculated results are stored in a memory (not shown) each time.

Figure 9:
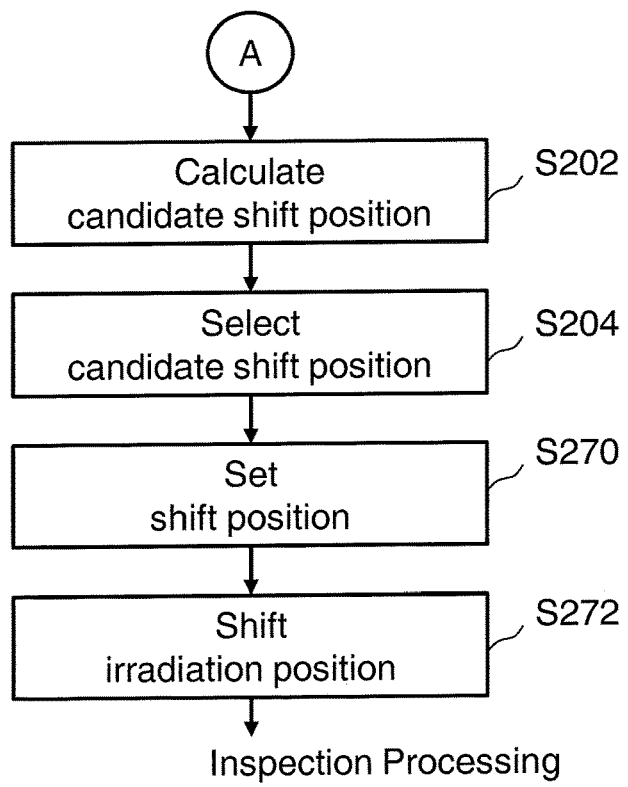
FIG. 9 is a flowchart showing the rest of the main steps of the sensitivity correction method of a multi-detector according to the first embodiment.

FIG. 9 is a flowchart showing the rest of the main steps of the sensitivity correction method of the multi-detector according to the first embodiment. In FIG. 9, the rest of the sensitivity correction method of the multi-detector of the first embodiment executes a series of steps: a candidate shift position calculating step (S202), a candidate shift position selecting step (S204), a shift position setting step (S270), and an irradiation position shifting step (S272). The example of FIG. 9 shows a method for correcting the sensitivity of a detected degraded pixel, as the remainder of the sensitivity correction method of the multi-detector according to the first embodiment.

In the candidate shift position calculating step (S202), the candidate shift position calculation unit 70 calculates an irradiatable position (candidate shift position) to which a corresponding secondary electron beam 11 irradiating each detection pixel 223 of the multi-detector 222 may shift within the same detection pixel from now on.

Figure 10:
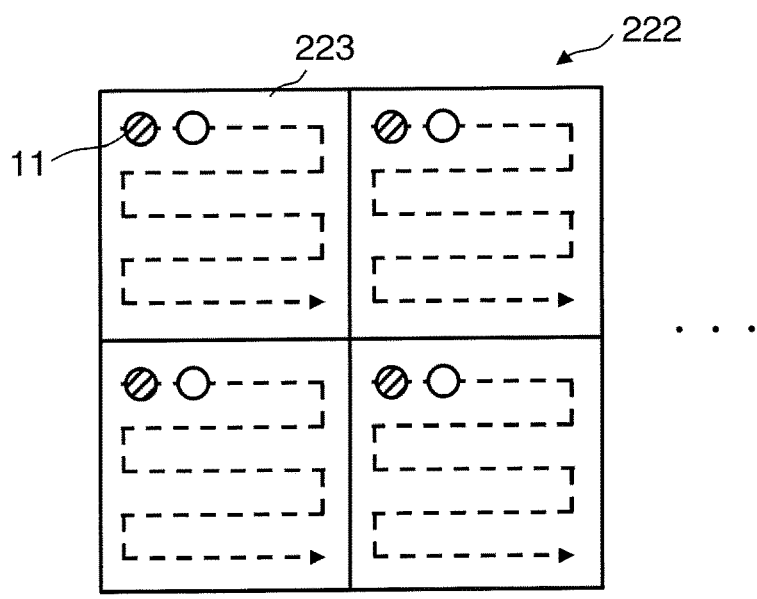
FIG. 10 shows an example of an irradiation position which shifts within a detection pixel according to the first embodiment.

FIG. 10 shows an example of an irradiation position which shifts within a detection pixel according to the first embodiment. The size of the light-receiving region of each detection pixel 223 of the multi-detector 222 is formed to be larger than the irradiation spot size of the secondary electron beam 11. Therefore, each secondary electron beam 11 irradiates only a part of the light-receiving region of the corresponding detection pixel 223. That is, at the irradiation spot portion of the secondary electron beam 11, the sensitivity of the detection pixel 223 deteriorates. Then, according to the first embodiment, the irradiation spot of the secondary electron beam 11 is moved (shifted) within the same detection pixel. In the case of FIG. 10, the irradiation position is shifted in the x direction from the position at the upper left corner of the light-receiving region of each detection pixel 223 in order at the pitch equal to or a little greater than the size of the irradiation spot of the secondary electron beam 11. Then, when reaching the right end, the irradiation position is shifted in the −y direction by one pitch, and then, the irradiation position is shifted in the −x direction in order at the pitch described above. By repeating this zigzag shifting motion, it is possible to shift the irradiation position from a degraded sensitivity portion to a normal portion. Then, the candidate shift position calculation unit 70 calculates coordinates of the candidate shift position which has not been irradiated yet and is a remaining irradiatable position in the light-receiving region of the detection pixel 223. The coordinates of the remaining irradiatable candidate shift positions are calculated in order along the zigzag trajectory shown in FIG. 10, for example.

In the candidate shift position selecting step (S204), the selection unit 72 selects one of the calculated coordinates of the remaining irradiatable candidate shift positions. According to the first embodiment, the selection unit 72 may select the coordinates of the candidate shift position adjoining along the zigzag trajectory shown in FIG. 10, for example.

In the shift position setting step (S270), when sensitivity of at least one detection pixel 223 has been degraded, the setting unit 74 sets a shifting destination (shift position) of the irradiation position of each of the multiple secondary electron beams 300, which irradiate a plurality of detection pixels 223, to be within a corresponding same detection pixel 223. Specifically, the coordinates of a selected candidate shift position are set.

In the irradiation position shifting step (S272), the movement processing unit 76 outputs a control signal for moving the detection stage 221, to the detector drive control circuit 136. Then, by moving the detection stage 221 (example of shifting unit), the detector drive control circuit 136 mechanically shifts arrangement positions of a plurality of detection pixels 223 corresponding to the multiple secondary electron beams 300. By the movement of the detection stage 221, each of the irradiation positions of the multiple secondary electron beams 300, which irradiate a plurality of detection pixels 223, is moved (shifted) to a shift position in the corresponding same light-receiving region of the detection pixel 223 concerned. Alternatively, the movement processing unit 76 outputs a control signal for moving the deflection position of the deflector 228, to the deflection control circuit 128. Then, by moving the deflection position of the deflector 228 (another example of shifting unit), the deflection control circuit 128 may electromagnetically shift the irradiation positions of the multiple secondary electron beams 300, which irradiate a plurality of detection pixels 223, to positions to be shifted. In either case, here, the irradiation position is switched (shifted) to a shift position in the same detection pixel 223 to be irradiated with each corresponding secondary electron beam 11. Consequently, as shown in FIG. 10, the irradiation position of the secondary electron beam 11 in each detection pixel 223 is shifted to an adjacent irradiation position (shift position) in the same detection pixel 223.

As described above, in each detection pixel 223, the secondary electron beam 11 can be detected at a new position which has not been used for detection of the secondary electron beam 11. Thereby, sensitivity of a degraded pixel can be corrected. Therefore, sensitivity of the multi-detector 222 can be improved. It is preferable that the flows of the sensitivity correction method of the multi-detector 222 shown in FIGS. 5 and 8 are executed each time before performing inspection of the inspection target substrate 101. Alternatively, the flows may be performed periodically, not performed for each substrate 101. Then, inspection processing of the inspection target substrate 101 is performed using the multi-detector 222 whose sensitivity has been corrected.

Figure 11:
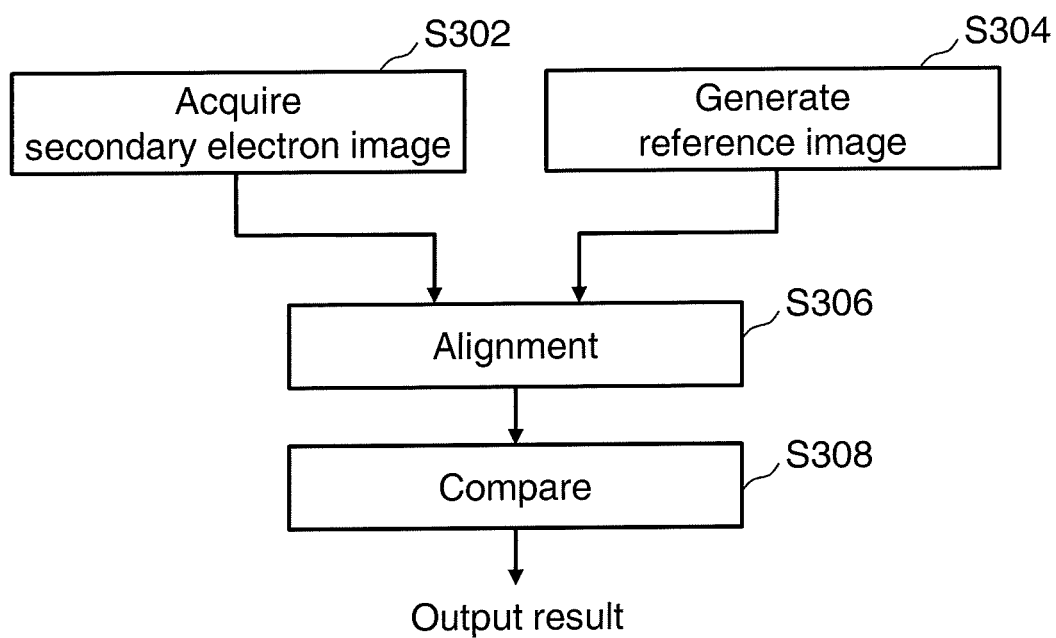
FIG. 11 is a flowchart showing main steps of an inspection method according to the first embodiment.

FIG. 11 is a flowchart showing main steps of an inspection method according to the first embodiment. In FIG. 11, the inspection method of the first embodiment executes a series of steps: a secondary electron image acquiring step (S302), a reference image generating step (S304), an alignment step (S306), and a comparing step (S308).

In the secondary electron image acquiring step (S302), the image acquisition mechanism 150 acquires, using the multiple beams 20, a secondary electron image of the inspection substrate 101 on which a figure pattern is formed.

Figure 12:
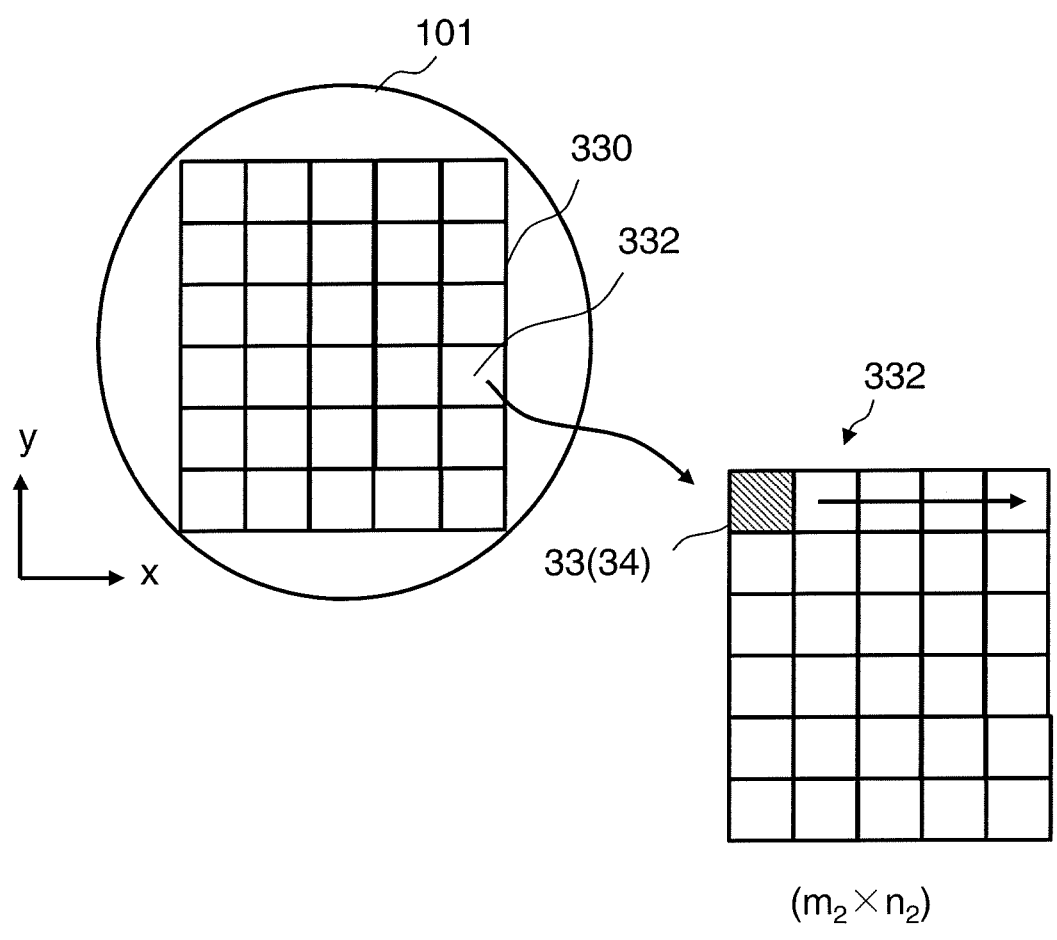
FIG. 12 shows an example of a plurality of chip regions formed on a semiconductor substrate of the first embodiment.

FIG. 12 shows an example of a plurality of chip regions formed on a semiconductor substrate of the first embodiment. In FIG. 12, in the case of the substrate 101 being a semiconductor substrate (wafer), a plurality of chips (wafer die) 332 in a two-dimensional array are formed in an inspection region 330 of the semiconductor substrate (wafer). A mask pattern for one chip formed on the exposure mask substrate is reduced to ¼, for example, and exposed/transferred onto each chip 332 by an exposure device (stepper) (not shown). The inside of each chip 332 is divided into a plurality of mask dies 33 of $m_2$ columns wide (width in the x direction) and $n_2$ rows long (length in the y direction) (each of $m_2$ and $n_2$ is an integer of 2 or greater), for example. In the first embodiment, the mask die 33 serves as a unit inspection region.

Figure 13:
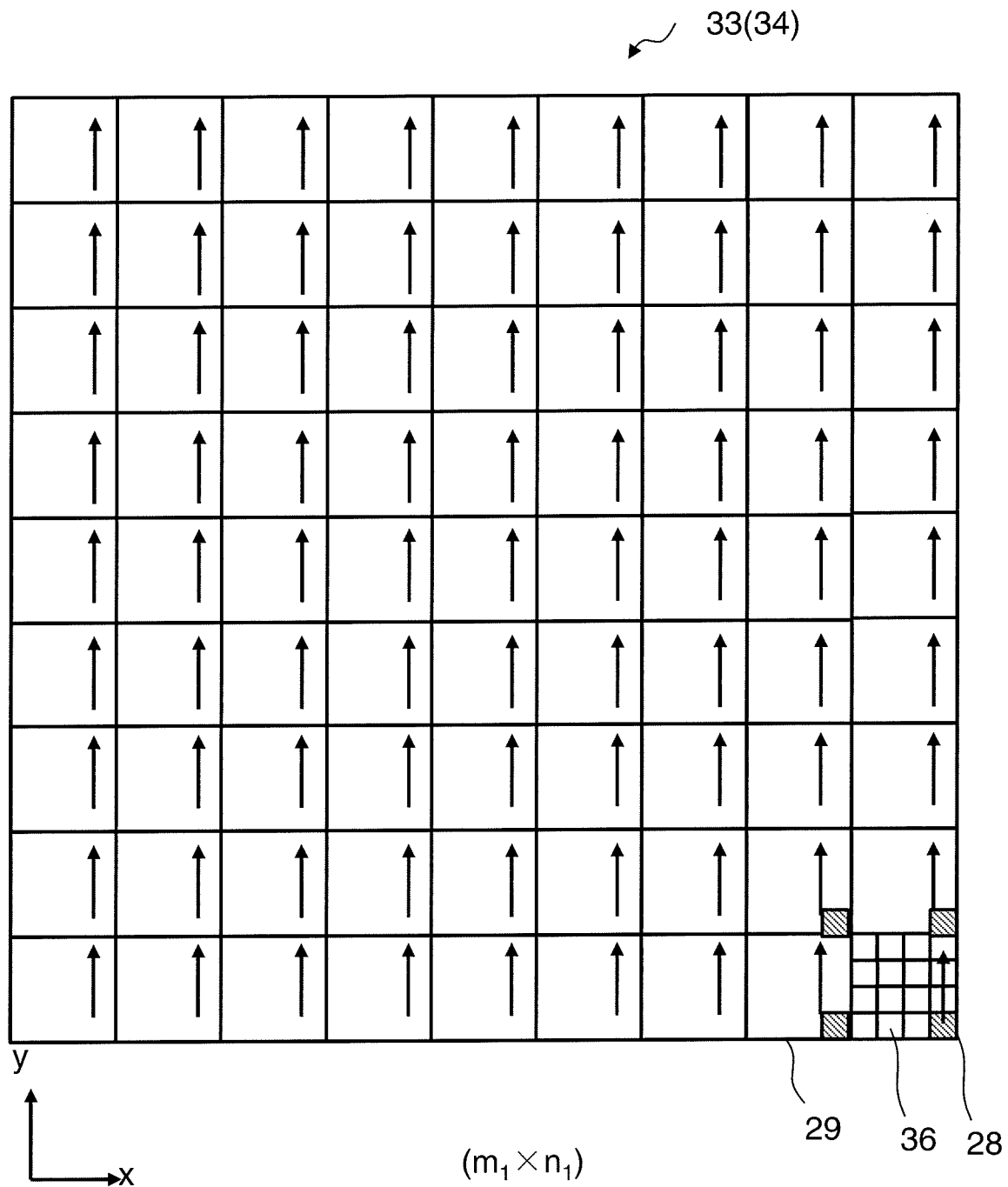
FIG. 13 shows an example of an irradiation region and a measurement pixel of multiple beams according to the first embodiment.

FIG. 13 shows an example of an irradiation region and a measurement pixel of multiple beams according to the first embodiment. In FIG. 13, each mask die 33 is divided into a plurality of mesh regions by the size of each beam of multiple beams 20, for example. Each mesh region serves as a measurement pixel 36 (unit irradiation region). FIG. 13 illustrates the case of multiple beams of 9×9 (rows by columns). The size of the irradiation region 34 that can be irradiated with one irradiation of the multiple beams 20 is defined by (x direction size obtained by multiplying pitch between beams in x direction of the multiple beams 20 by the number of beams in the x direction on the substrate 101)×(y direction size obtained by multiplying pitch between beams in y direction of the multiple beams 20 by the number of beams in the y direction on the substrate 101). In the case of FIG. 13, the irradiation region 34 and the mask die 33 are of the same size. However, it is not limited thereto. The irradiation region 34 may be smaller than the mask die 33, or larger than it. In the irradiation region 34, there are shown a plurality of measurement pixels 28 (irradiation positions of beams of one shot) which can be irradiated with one irradiation of the multiple beams 20. In other words, the pitch between adjacent measurement pixels 28 serves as the pitch between beams of the multiple beams. In the case of FIG. 13, one sub-irradiation region 29 is a square region surrounded at four corners by four adjacent measurement pixels 28, and including one of the four measurement pixels 28. In the example of FIG. 13, each sub-irradiation region 29 is composed of 4x4 (rows by columns) the measurement pixels 36.

In the scanning operation according to the first embodiment, scanning is performed for each mask die 33. FIG. 13 shows the case of scanning one mask die 33. When all of the multiple beams 20 are used, there are arranged $m_1 \times n_1$ sub-irradiation regions 29 in the x and y directions (two-dimensionally) in one irradiation region 34. The XY stage 105 is moved to a position where the first mask die 33 can be irradiated with the multiple beams 20. Then, while the main deflector 208 is performing tracking deflection so as to follow the movement of the XY stage 105, the sub deflector 209 scans, in the state of being tracking-deflected, the inside of the mask die 33 concerned being regarded as the irradiation region 34. Each beam of the multiple beams 20 is associated with any one of the sub-irradiation regions 29 which are different from each other. At the time of each shot, each beam irradiates one measurement pixel 28 corresponding to the same position in the associated sub-irradiation region 29. In the case of FIG. 13, the sub deflector 209 performs deflection such that the first shot of each beam irradiates the first measurement pixel 36 from the right in the bottom row in the sub-irradiation region 29 concerned. Thus, irradiation of the first shot is performed. Then, the beam deflection position is shifted in the y direction by the amount of one measurement pixel 36 by collectively deflecting all of the multiple beams 20 by the sub deflector 209, and the second shot irradiates the first measurement pixel 36 from the right in the second row from the bottom in the sub-irradiation region 29 concerned. Similarly, the third shot irradiates the first measurement pixel 36 from the right in the third row from the bottom in the sub-irradiation region 29 concerned. The fourth shot irradiates the first measurement pixel 36 from the right in the fourth row from the bottom in the sub-irradiation region 29 concerned. Next, the beam deflection position is shifted to the second measurement pixel 36 from the right in the bottom row by collectively deflecting all of the multiple beams 20 by the sub deflector 209. Similarly, the measurement pixels 36 are irradiated in order in the y direction. By repeating this operation, one beam irradiates all the measurement pixels 36 in order in one sub-irradiation region 29. By performing one shot, the multiple secondary electrons 300 corresponding to a plurality of shots whose maximum number is the same as the number of a plurality of holes 22 are detected at a time by the multiple beams formed by passing through the plurality of holes 22 in the shaping aperture array substrate 203.

As described above, the whole multiple beams 20 scans the mask die 33 as the irradiation region 34, and that is, each beam individually scans one corresponding sub-irradiation region 29. After scanning one mask die 33 is completed, the irradiation region 34 is moved to a next adjacent mask die 33 in order to scan the next adjacent mask die 33. This operation is repeated to proceed scanning of each chip 332. Due to shots of the multiple beams 20, secondary electrons are emitted from the irradiated measurement pixels 36 at each shot time, and detected by the multi-detector 222. According to the first embodiment, each detection pixel 223 of the multi-detector 222 detects the secondary electron beam 11 emitted upward from each measurement pixel 36, for each measurement pixel 36 (or each sub-irradiation region 29).

By performing scanning using the multiple beams 20 as described above, the scanning operation (measurement) can be performed at a speed higher than that of scanning by a single beam. The scanning of each mask die 33 may be performed by the "step and repeat" operation, alternatively it may be performed by continuously moving the XY stage 105. When the irradiation region 34 is smaller than the mask die 33, it will suffice to perform the scanning operation while moving the irradiation region 34 in the mask die 33 concerned.

When the substrate 101 is an exposure mask substrate, the chip region for one chip formed on the exposure mask substrate is divided into a plurality of stripe regions in a strip form by the size of the mask die 33 described above, for example. Then, for each stripe region, scanning is performed for each mask die 33 in the same way as described above. Since the size of the mask die 33 on the exposure mask substrate is the size before being transferred and exposed, it is four times the mask die 33 on the semiconductor substrate. Therefore, if the irradiation region 34 is smaller than the mask die 33 on the exposure mask substrate, the scanning operation for one chip increases (e.g., four times). However, since a pattern for one chip is formed on the exposure mask substrate, the number of times of scanning can be less compared to the case of the semiconductor substrate on which more than four chips are formed.

As described above, using the multiple beams 20, the image acquisition mechanism 150 scans the substrate 101 to be inspected, on which a figure pattern is formed, and detects the multiple secondary electron beams 300 emitted from the inspection substrate 101 due to it being irradiated with the multiple beams 20. Detected data on a secondary electron (secondary electron image: measured image: image to be inspected) from each measurement pixel 36 detected by the multi-detector 222 is output to the detection circuit 106 in order of measurement. In the detection circuit 106, the detected data in analog form is converted into digital data by an A-D converter (not shown), and stored in the chip pattern memory 123. Thus, the image acquisition mechanism 150 acquires a measured image of a pattern formed on the substrate 101. Then, for example, when the detected data for one chip 332 has been accumulated, the accumulated data is transmitted as chip pattern data to the comparison circuit 108, with information data on each position from the position circuit 107.

In the reference image generating step (S304), based on design data serving as a basis for forming a pattern on the substrate 101, or design pattern data defined in exposure image data of a pattern formed on the substrate 101, the reference image generation circuit 112 generates a reference image for each mask die. Specifically, it operates as follows: First, design pattern data is read from the storage device 109 through the control computer 110, and each figure pattern defined in the read design pattern data is converted into image data of binary or multiple values.

Here, basics of figures defined by design pattern data are, for example, rectangles and triangles. For example, there is stored figure data defining the shape, size, position, and the like of each pattern figure by using information, such as coordinates (x, y) of the reference position of the figure, lengths of sides of the figure, and a figure code serving as an identifier for identifying the figure type such as a rectangle, a triangle and the like.

When design pattern data, used as figure data, is input to the reference image generation circuit 112, the data is developed into data of each figure. Then, the figure code, the figure dimensions and the like indicating the figure shape in the data of each figure are interpreted. Then, the reference image generation circuit 112 develops each figure data to design pattern image data of binary or multiple values as a pattern to be arranged in a mesh region in units of grids of predetermined quantization dimensions, and outputs the developed data. In other words, the reference image generation circuit 112 reads design data, calculates an occupancy rate occupied by a figure in the design pattern, for each mesh region obtained by virtually dividing an inspection region into grid squares in units of predetermined dimensions, and outputs n-bit occupancy rate data. For example, it is preferable that one mesh region is set as one pixel. Assuming that one pixel has a resolution of $\frac{1}{2^8}(=\frac{1}{256})$, the occupancy rate in each pixel is calculated by allocating small regions which correspond to the region of figures arranged in the pixel concerned and each of which is corresponding to a $\frac{1}{256}$ resolution. Then, 8-bit occupancy rate data is output to the reference circuit 112. The mesh region (inspection pixel) may be in accordance with the pixel of measured data.

Next, the reference image generation circuit 112 performs appropriate filter processing on design image data of a design pattern which is image data of a figure. Since optical image data as a measured image is in the state affected by filtering performed by the optical system, in other words, in the analog state continuously changing, it is possible to match/fit the design image data with the measured data by also applying a filtering process to the design image data being image data on the design side whose image intensity (gray value) is represented by digital values. The generated image data of a reference image is output to the comparison circuit 108 and stored in a memory (not shown) in the comparison circuit 108.

In the comparison circuit 108 (inspection unit, inspection circuit) inspects a pattern formed on the substrate 101, using information on the multiple secondary electron beams 300 detected by the multi-detector 222. Specifically, it operates as follows:

In the alignment step (S306), the comparison circuit 108 provides alignment (positioning) between a mask die image serving as an inspection image, and a mask die image serving as a reference image. For example, the alignment is provided using a least-squares method. Here, a mask die image is used as the inspection image, for example.

In the comparison step (S308), the comparison unit 108 compares a measured image measured from the substrate 101 with a corresponding reference image. Specifically, a position-aligned inspection image and a reference image are compared with each other for each pixel. The comparison between them is performed for each pixel according to predetermined determination conditions, using a predetermined determination threshold value, in order to determine, for example, whether there is a defect such as a shape defect. For example, if a gray scale value difference for each pixel is larger than a determination threshold value Th, it is determined to be a candidate defect. Then, the comparison result is output, and specifically, may be output to the storage device 109, monitor 117, or memory 118, or alternatively, output from the printer 119.

Instead of the die-to-database inspection described above, the die-to-die inspection may be performed. In the case of the die-to-die inspection, data of measured images obtained by imaging identical patterns at different positions on the same substrate 101 are compared. Therefore, from the substrate 101 on which identical patterns (first and second figure patterns) are formed at different positions, the image acquisition mechanism 150 acquires, using the multiple beams 20 (electron beams), measured images being secondary electron images one of which corresponds to the figure pattern (first figure pattern) and the other of which corresponds to the other figure pattern (second figure pattern). In that case, one of the acquired measured images of the figure patterns is treated as a reference image, and the other one is treated as an inspection image. The acquired images of the figure pattern (first figure pattern) and the other figure pattern (second figure pattern) may be in the same chip pattern data, or in different chip pattern data. The method for inspection may be the same as that of the die-to-database inspection.

As described above, according to the first embodiment, it is possible to extend the life of the multi-detector 222 used in the case of acquiring images by using multiple beams. Therefore, it is possible to improve the operating rate (utilization ratio) of the inspection apparatus 100.

Second Embodiment

In the above first embodiment, the irradiation position of the secondary electron beam 11 is shifted in a pre-set order in the light-receiving region of the detection pixel 223 of the multi-detector 222. However, the correction method of the multi-detector 222 is not limited thereto. In a second embodiment, there will be described a configuration for optimizing the position to be shifted. The configuration of the inspection apparatus 100 in the second embodiment is the same as that of FIG. 1. Moreover, a part of the main steps of the sensitivity correction method of the multi-detector according to the second embodiment are the same as those in FIG. 5. Moreover, the main steps of the inspection method according to the second embodiment are the same as those in FIG. 11. The contents of the second embodiment are the same as those of the first embodiment except for what is specifically described below.

Similarly to the first embodiment, there is performed each step of the method for determining whether a detection pixel (degraded pixel) whose detection sensitivity has been degraded exists or not as shown in FIG. 5, and, in other words, there is performed each step of the detection method for a degraded pixel. Thereby, it is possible to detect which detection pixel 223 is a degraded pixel.

Figure 14:
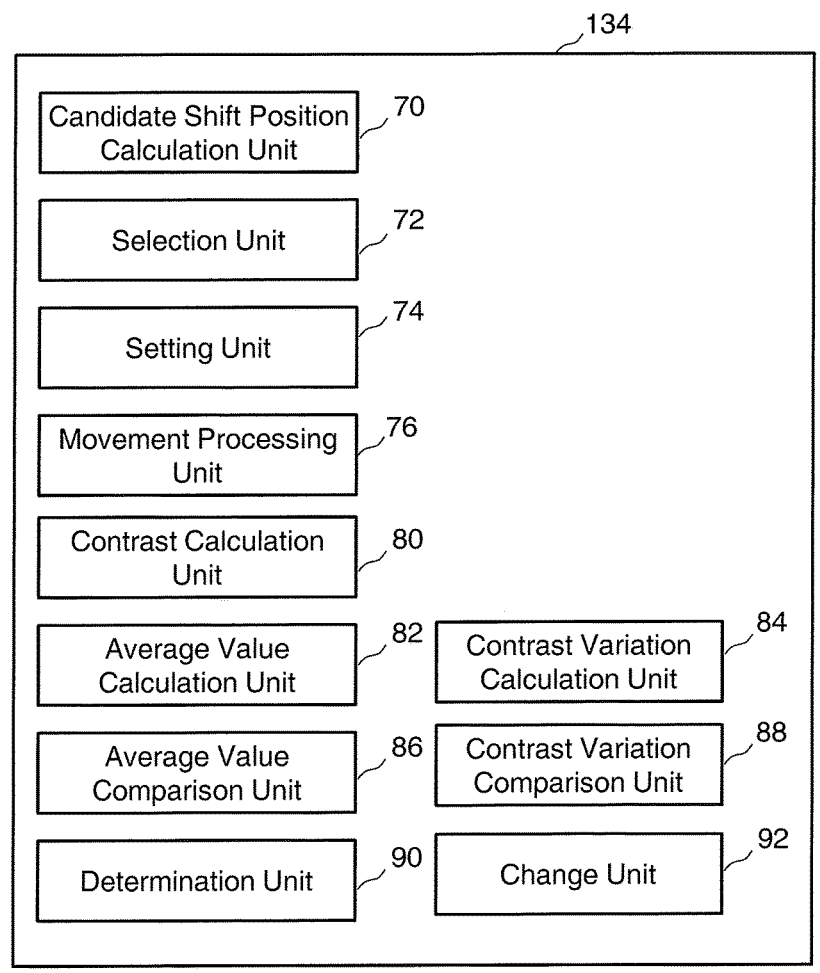
FIG. 14 is a block diagram showing an example of an internal structure of an irradiation position adjustment circuit according to a second embodiment.

FIG. 14 is a block diagram showing an example of an internal structure of an irradiation position adjustment circuit according to the second embodiment. As shown in FIG. 14, in addition to the internal structure shown in FIG. 8, a contrast calculation unit 80, an average value calculation unit 82, a contrast variation calculation unit 84, an average value comparison unit 86, a contrast variation comparison unit 88, a determination unit 90, and a change unit 92 are further arranged in the irradiation position adjustment circuit 134 of the second embodiment. Each of the "units" such as the candidate shift position calculation unit 70, the selection unit 72, the setting unit 74, the movement processing unit 76, the contrast calculation unit 80, the average value calculation unit 82, the contrast variation calculation unit 84, the average value comparison unit 86, the contrast variation comparison unit 88, the determination unit 90, and the change unit 92 includes a processing circuitry. As the processing circuitry, for example, an electric circuit, computer, processor, circuit board, quantum circuit, semiconductor device, or the like can be used. Each of the "units" may use a common processing circuitry (same processing circuitry), or different processing circuitries (separate processing circuitries). Input data required in the candidate shift position calculation unit 70, the selection unit 72, the setting unit 74, the movement processing unit 76, the contrast calculation unit 80, the average value calculation unit 82, the contrast variation calculation unit 84, the average value comparison unit 86, the contrast variation comparison unit 88, the determination unit 90, and the change unit 92, and calculated results are stored in a memory (not shown) each time.

Figure 15:
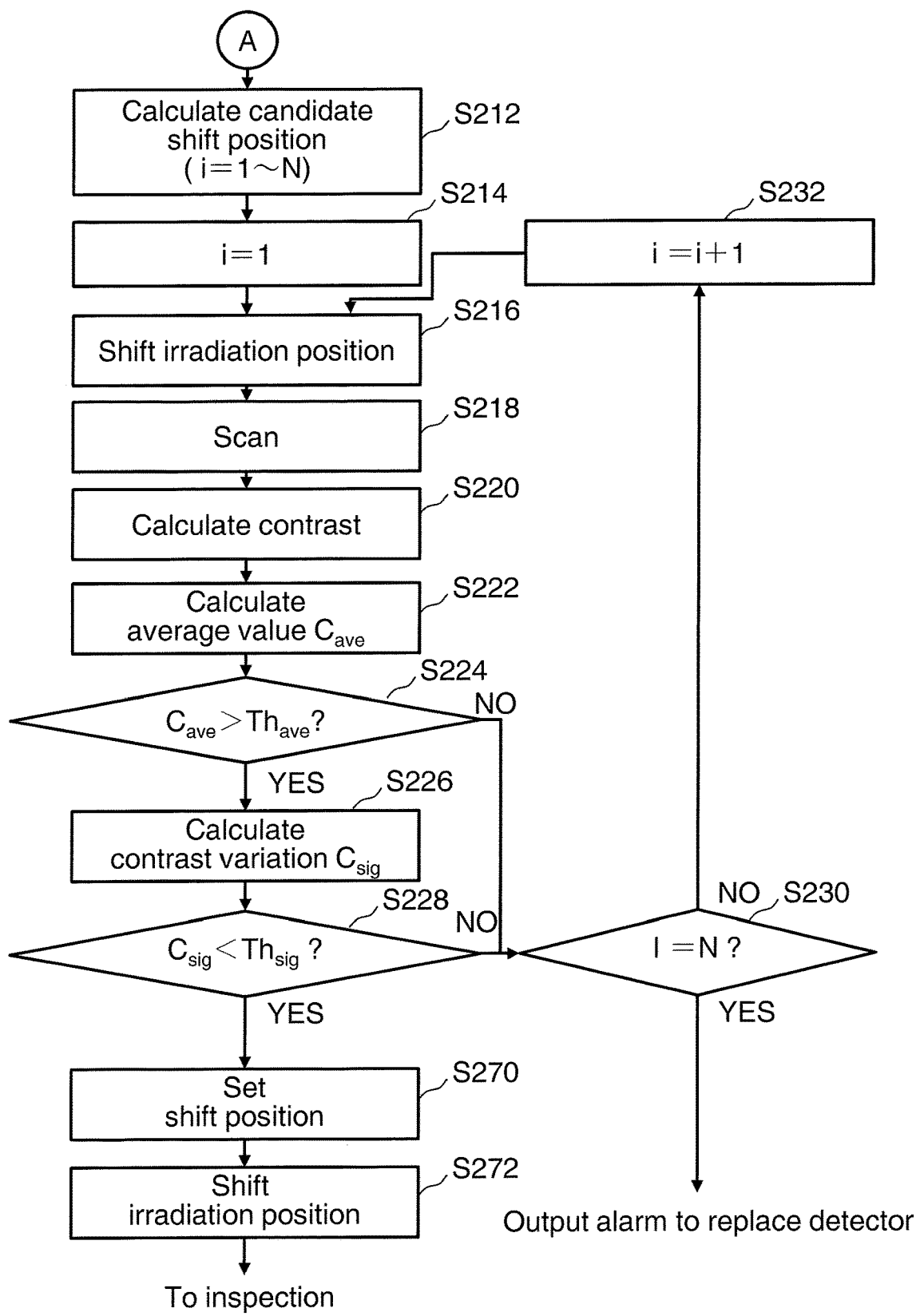
FIG. 15 is a flowchart showing the rest of the main steps of the sensitivity correction method of the multi-detector according to the second embodiment.

FIG. 15 is a flowchart showing the rest of the main steps of the sensitivity correction method of the multi-detector according to the second embodiment. In FIG. 15, the rest of the sensitivity correction method of the multi-detector of the second embodiment executes a series of steps: a candidate shift position calculating step (S212), a candidate shift position selecting step (S214), an irradiation position shifting step (S216), a scanning step (S218), a contrast calculating step (S220), an average value calculating step (S222), a determining step (S224), a contrast variation calculating step (S226), a determining step (S228), a determining step (S230), a candidate shift position changing step (S232), a shift position setting step (S270), and an irradiation position shifting step (S272). The example of FIG. 15 shows the remainder of the sensitivity correction method of the multi-detector according to the second embodiment which continuously comes after a part of the main steps of the sensitivity correction method of the multi-detector 222 shown in FIG. 5.

In the candidate shift position calculating step (S212), the candidate shift position calculation unit 70 calculates an irradiatable position (candidate shift position) to which a corresponding secondary electron beam 11 irradiating each detection pixel 223 of the multi-detector 222 may shift within the same detection pixel from now on. Then, an index number i=1 to N (N being a natural number) is given to each calculated candidate shift position (coordinates). As explained with reference to the example of FIG. 10, the irradiatable position (candidate shift position) of the secondary electron beam 11 is calculated on the supposition that shifting is performed at the pitch equal to or a little greater than the size of the irradiation spot of the secondary electron beam 11. The index number i of the shift position is given in order along the zigzag trajectory shown in FIG. 10, for example. In other words, the index number i is given, for example in order of coordinates.

In the candidate shift position selecting step (S214), the selection unit 72 selects one candidate shift position from one or more (at least one) candidate shift positions. Here, the index number i=1 is selected.

In the irradiation position shifting step (S216), the detection stage 221 (shifting unit) shifts the irradiation positions of the multiple secondary electron beams 200 within respective corresponding detection pixels 223. The movement processing unit 76 outputs a control signal for moving the detection stage 221, to the detector drive control circuit 136. Then, by moving the detection stage 221 (example of shifting unit), the detector drive control circuit 136 mechanically shifts arrangement positions of a plurality of detection pixels 223 corresponding to the multiple secondary electron beams 300. By the movement of the detection stage 221, each of the irradiation positions of the multiple secondary electron beams 300, which irradiate a plurality of detection pixels 223, is temporarily moved (shifted) to a candidate shift position designated by the index number i in the light-receiving region of the corresponding detection pixel 223 concerned. Since the steps necessary for optimization of the shift position are repeated as described later, the detection stage 221 (shifting unit) shifts at least once the irradiation positions of the multiple secondary electron beams 200 within respective corresponding detection pixels 223. Alternatively, the movement processing unit 76 outputs a control signal for moving the deflection position of the deflector 228, to the deflection control circuit 128. Then, by moving the deflection position of the deflector 228 (another example of shifting unit), the deflection control circuit 128 may electromagnetically temporarily shift the irradiation positions of the multiple secondary electron beams 300, which irradiate a plurality of detection pixels 223, to respective candidate shift positions each designated by the index number i. In that case, the deflector 228 (another example of shifting unit) shifts at least once the irradiation positions of the multiple secondary electron beams 200 within respective corresponding detection pixels 223. In either case, here, the irradiation position is switched (shifted) to another position in the same detection pixel 223 to be irradiated with each corresponding secondary electron beam 11.

In the scanning step (S218), under the control of the evaluation pattern measurement circuit 130, the image acquisition mechanism 150 scans an evaluation pattern with the multiple beams 20. Then, the multi-detector 222 detects the multiple secondary electron beams 300 obtained by scanning the evaluation pattern with the multiple beams 20.

Then, the multi-detector 222 detects the multiple secondary electron beams 300 emitted from the evaluation mark 217 by irradiation with the multiple beams 20. Detected data is output to the detection circuit 106 in order of measurement. In the detection circuit 106, the detected data in analog form is converted to digital data by an A-D converter (not shown) to be stored in the chip pattern memory 123. A secondary electron image detected by each detection pixel 223 serves as a measured image of the corresponding figure pattern 13. Thereby, the image acquisition mechanism 150 acquires the measured image of the evaluation pattern formed on the evaluation mark 217. Here, the irradiation position which is to be irradiated with each secondary electron beam 11 of the multiple secondary electron beams 300 emitted by irradiation of the multiple beams 20 to irradiate within the detection pixel 223 of the multi-detector 222 is temporarily shifted to a position designated by the index number i.

In the contrast calculating step (S220), in the state where the irradiation positions of the multiple secondary electron beams 300 have been shifted at least once, the contrast calculation unit 80 calculates, using an evaluation pattern, a contrast of a secondary electron beam image for each of a plurality of detection pixels 223, based on a detection result obtained when detecting, by the multi-detector 222, the multiple secondary electron beams 300 obtained by scanning the evaluation pattern with the multiple beams 20. Specifically, the value of contrast between the figure pattern 13 and the surrounding portion of the figure pattern 13 is calculated from the secondary electron image of the corresponding figure pattern 13 detected by each detection pixel 223. For example, the difference value between detected intensities is calculated.

In the average value calculating step (S222), the average value calculation unit 82 calculates a contrast average value $C_{ave}$ of all the detection pixels of a plurality of detection pixels 223 in the case where each secondary electron beam 11 is detected at the candidate shift position designated by the index number i.

In the determining step (S224), the average value comparison unit 86 compares a calculated contrast average value $C_{ave}$ and the average value threshold $Th_{ave}$. Specifically, the average value comparison unit 86 determines whether the contrast average value $C_{ave}$ of all the detection pixels 223 is greater than the average value threshold $Th_{ave}$ in the case where each secondary electron beam 11 is detected at the candidate shift position designated by the index number i. When the contrast average value $C_{ave}$ of all the detection pixels 223 is greater than the average value threshold $Th_{ave}$, it goes to the contrast variation calculating step (S226). When the contrast average value $C_{ave}$ of all the detection pixels 223 is not greater than the average value threshold $Th_{ave}$, it goes to the determining step (S230).

In the contrast variation calculating step (S226), the contrast variation calculation unit 84 calculates a contrast variation $C_{sig}$ of all the detection pixels of a plurality of detection pixels 223. As the contrast variation $C_{sig}$, the standard deviation of the contrast values of all the detection pixels 223 is calculated, for example.

In the determining step (S228), the contrast variation comparison unit 88 compares a calculated contrast variation $C_{sig}$ and the variation threshold $Th_{sig}$. Specifically, the contrast variation comparison unit 88 determines whether the contrast variation $C_{sig}$ of all the detection pixels 223 is smaller than the variation threshold $Th_{sig}$ in the case where each secondary electron beam 11 is detected at the candidate shift position designated by the index number i. When the contrast variation $C_{sig}$ of all the detection pixels 223 is smaller than the variation threshold $Th_{sig}$, it goes to the candidate shift position changing step (S232). When the contrast variation $C_{sig}$ of all the detection pixels 223 is not smaller than the variation threshold $Th_{sig}$, it goes to the determining step (S230).

In the determining step (S230), the determination unit 90 determines whether the index number i being currently set is the last number N or not. When the index number i is not the last number N, it goes to the candidate shift position changing step (S232). When the index number i is the last number N, an alarm to prompt replacement of the multi-detector 222 is output, and it ends.

In the candidate shift position changing step (S232), the change unit 92 changes the candidate shift position of the index number i being currently set to another candidate shift position in a plurality of calculated candidate shift positions. Here, it is changed to the candidate shift position designated by the index number obtained by adding 1 to the index number i. Since the index number i has not yet been the last number N when executing the candidate shift position changing step (S232), it should be understood that a plurality of candidate shift positions have been calculated in the candidate shift position calculating step (S212).

Then, it returns to the irradiation position shifting step (S216), and each step from the irradiation position shifting step (S216) to the candidate shift position changing step (S232) is repeated until it is determined in the determining step (S228) that the contrast variation $C_{sig}$ of all the detection pixels 223 is smaller than the variation threshold $Th_{sig}$, or it is determined in the determining step (S230) that the index number i is the last number N. Thereby, it is possible to find/detect a candidate shift position where the contrast average value $C_{ave}$ is greater than the average value threshold $Th_{ave}$, and the contrast variation $C_{sig}$ is smaller than the variation threshold $Th_{sig}$.

In the shift position setting step (S270), when sensitivity of at least one detection pixel 223 has been degraded, the setting unit 74 sets a shifting destination of the irradiation position of each of the multiple secondary electron beams 300, which irradiate a plurality of detection pixels 223, to be within a corresponding same detection pixel 223. Specifically, based on a comparison result of the contrast average value $C_{ave}$ and a comparison result of the contrast variation $C_{sig}$, the setting unit 74 sets shifting destinations of the irradiation positions of the multiple secondary electron beams 300 to be within respective corresponding detection pixels. More specifically, the setting unit 74 sets the coordinates of the shift position to be coordinates of a candidate shift position where the contrast average value $C_{ave}$ is greater than the average value threshold $Th_{ave}$, and the contrast variation $C_{sig}$ is smaller than the variation threshold $Th_{sig}$.

In the irradiation position shifting step (S272), the movement processing unit 76 outputs a control signal for moving the detection stage 221, to the detector drive control circuit 136. Then, by moving the detection stage 221 (example of shifting unit), the detector drive control circuit 136 mechanically shifts arrangement positions of a plurality of detection pixels 223 corresponding to the multiple secondary electron beams 300. By the movement of the detection stage 221, each of the irradiation positions of the multiple secondary electron beams 300, which irradiate a plurality of detection pixels 223, is moved (shifted) to a shift position in the corresponding same light-receiving region of the detection pixel 223 concerned. Alternatively, the movement processing unit 76 outputs a control signal for moving the deflection position of the deflector 228, to the deflection control circuit 128. Then, by moving the deflection position of the deflector 228 (another example of shifting unit), the deflection control circuit 128 may electromagnetically shift the irradiation positions of the multiple secondary electron beams 300, which irradiate a plurality of detection pixels 223, to positions to be shifted. In either case, here, the irradiation position is switched (shifted) in the same detection pixel 223 to be irradiated with each corresponding secondary electron beam 11. Consequently, the irradiation position specified in S270, such as the irradiation position of the secondary electron beam 11 in each detection pixel 223, as shown in the example of FIG. 10, is shifted to an adjacent irradiation position in the same detection pixel 223.

As described above, in the light-receiving region of each detection pixel 223, the secondary electron beam 11 can be detected at a shift position which has not been used for detection of the secondary electron beam 11, and on which the contrast average value $C_{ave}$ is greater than the average value threshold $Th_{ave}$, and the contrast variation $C_{sig}$ is smaller than the variation threshold $Th_{sig}$. Thereby, sensitivity of a degraded pixel can be corrected. Therefore, sensitivity of the multi-detector 222 can be improved. Similarly to the first embodiment, it is preferable that the flows of the sensitivity correction method of the multi-detector 222 shown in FIGS. 5 and 8 are executed each time before performing inspection of the inspection target substrate 101. Alternatively, the flows may be performed periodically, not performed for each substrate 101. Then, inspection processing of the inspection target substrate 101 is performed using the multi-detector 222 whose sensitivity has been corrected. The main steps of the inspection method according to the second embodiment are the same as those of FIG. 11.

As described above, according to the second embodiment, it is possible to perform adaptation of the shift position in the light-receiving region of the detection pixel 223 more suitably than the first embodiment. Therefore, the life of the multi-detector 222 used in the case of acquiring images by using multiple beams can be extended with greater accuracy than the first embodiment. Thus, the operating rate (utilization ratio) of the inspection apparatus 100 can be improved.

Third Embodiment

In the above second embodiment, it is checked, in order of the index given, for example in order of coordinates, whether the candidate shift position (irradiatable position) designated by each index number suits the shift position in the light-receiving region of the detection pixel 223. However, the method for detecting a shift position suitably adapted is not limited thereto. In a third embodiment, there will be described another configuration for optimizing the position to be shifted. The configuration of the inspection apparatus 100 in the third embodiment is the same as that of FIG. 1. Moreover, a part of the main steps of the sensitivity correction method of the multi-detector according to the third embodiment are the same as those in FIG. 5. Moreover, the main steps of the inspection method according to the third embodiment are the same as those in FIG. 11. The contents of the third embodiment are the same as those of the first or second embodiment except for what is specifically described below.

Similarly to the first embodiment, there is performed each step of the method for determining whether a detection pixel (degraded pixel) whose detection sensitivity has been degraded exists or not as shown in FIG. 5, and, in other words, there is performed each step of the detection method for a degraded pixel. Thereby, it is possible to detect which detection pixel 223 is a degraded pixel.

Figure 16:
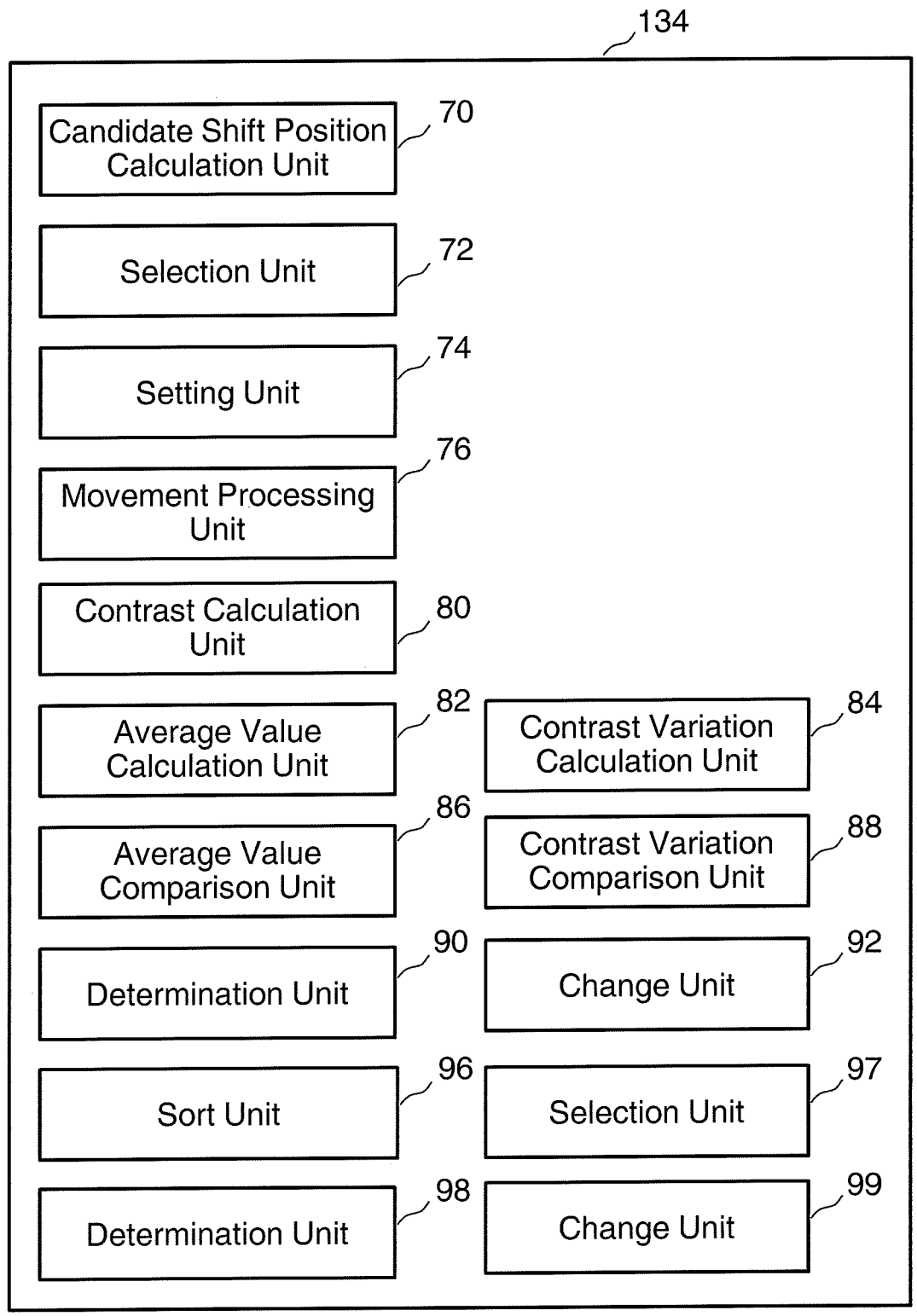
FIG. 16 is a block diagram showing an example of an internal structure of an irradiation position adjustment circuit according to a third embodiment.

FIG. 16 is a block diagram showing an example of an internal structure of an irradiation position adjustment circuit according to the third embodiment. FIG. 16 is the same as FIG. 14 except that, in the irradiation position adjustment circuit 134 of the third embodiment, a sort unit 96, a selection unit 97, a determination unit 98, and a change unit 99 are additionally arranged. Each of the "units" such as the candidate shift position calculation unit 70, the selection unit 72, the setting unit 74, the movement processing unit 76, the contrast calculation unit 80, the average value calculation unit 82, the contrast variation calculation unit 84, the average value comparison unit 86, the contrast variation comparison unit 88, the determination unit 90, the change unit 92, the sort unit 96, the selection unit 97, the determination unit 98, and the change unit 99 includes a processing circuitry. As the processing circuitry, for example, an electric circuit, computer, processor, circuit board, quantum circuit, semiconductor device, or the like can be used. Each of the "units" may use a common processing circuitry (same processing circuitry), or different processing circuitries (separate processing circuitries). Input data required in the candidate shift position calculation unit 70, the selection unit 72, the setting unit 74, the movement processing unit 76, the contrast calculation unit 80, the average value calculation unit 82, the contrast variation calculation unit 84, the average value comparison unit 86, the contrast variation comparison unit 88, the determination unit 90, the change unit 92, the sort unit 96, the selection unit 97, the determination unit 98, and the change unit 99, and calculated (operated) results are stored in a memory (not shown) each time.

Figure 17:
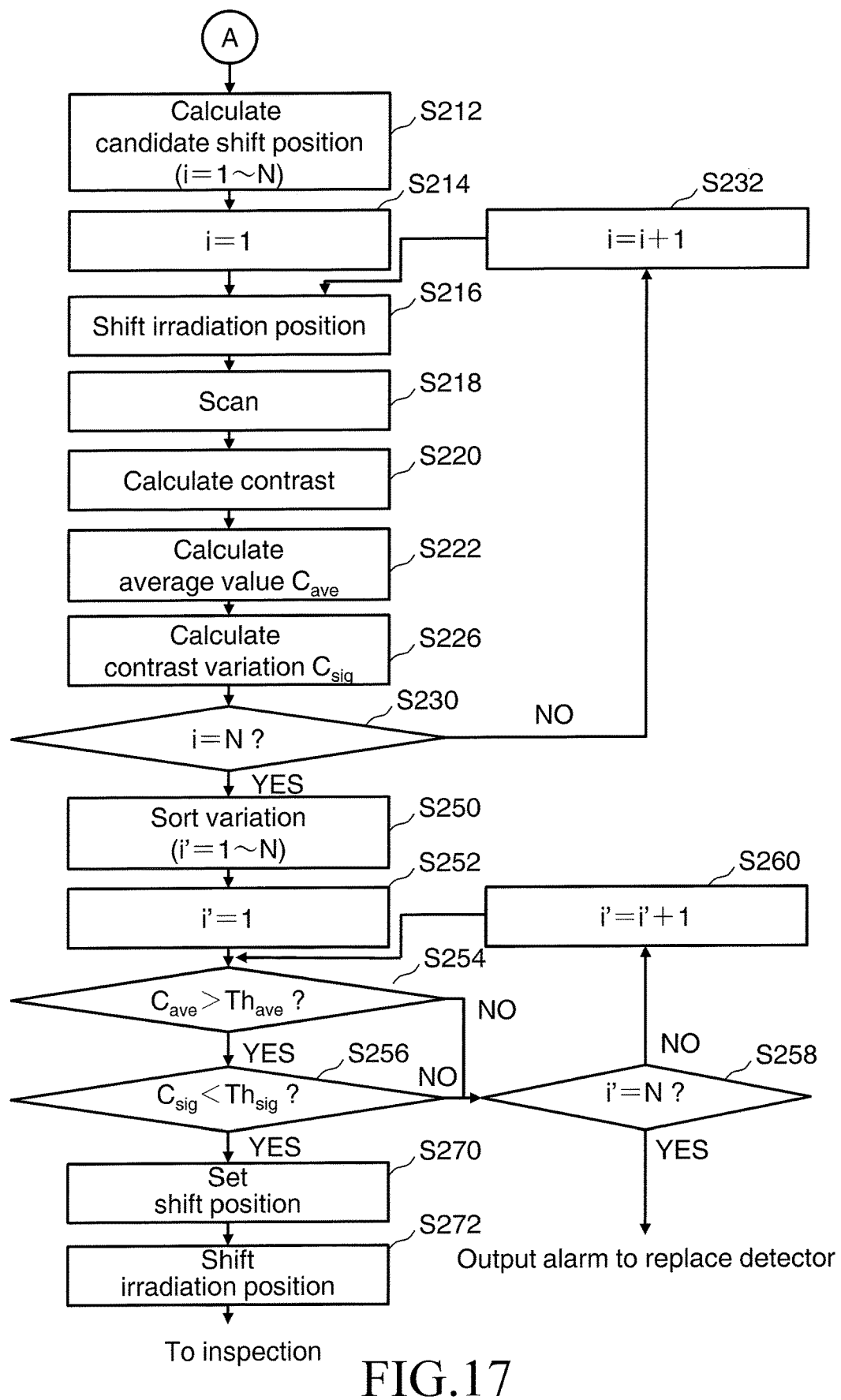
FIG. 17 is a flowchart showing the rest of the main steps of the sensitivity correction method of the multi-detector according to the third embodiment.

FIG. 17 is a flowchart showing the rest of the main steps of the sensitivity correction method of the multi-detector according to the third embodiment. In FIG. 17, the rest of the sensitivity correction method of the multi-detector of the third embodiment executes a series of steps: the candidate shift position calculating step (S212), the candidate shift position selecting step (S214), the irradiation position shifting step (S216), the scanning step (S218), the contrast calculating step (S220), the average value calculating step (S222), the contrast variation calculating step (S226), the determining step (S230), the candidate shift position changing step (S232), a contrast variation sorting step (S250), a candidate shift position selecting step (S252), a determining step (S254), a determining step (S256), a determining step (S258), a changing step (S260), the shift position setting step (S270), and the irradiation position shifting step (S272). The example of FIG. 17 shows the remainder of the sensitivity correction method of the multi-detector according to the third embodiment which continuously comes after a part of the main steps of the sensitivity correction method of the multi-detector 222 shown in FIG. 5.

The contents of each step of the candidate shift position calculating step (S212), the candidate shift position selecting step (S214), the irradiation position shifting step (S216), the scanning step (S218), the contrast calculating step (S220), the average value calculating step (S222), and the contrast variation calculating step (S226) are the same as those of the second embodiment.

In the determining step (S230), the determination unit 90 determines whether the index number i being currently set is the last number N or not. When the index number i is not the last number N, it goes to the candidate shift position changing step (S232). When the index number i is the last number N, it goes to the contrast variation sorting step (S250).

In the candidate shift position changing step (S232), the change unit 92 changes the candidate shift position of the index number i being currently set to another candidate shift position in a plurality of calculated candidate shift positions. Here, it is changed to a shift position designated by the index number obtained by adding 1 to the index number i. Since the index number i has not yet been the last number N when executing the candidate shift position changing step (S232), it should be understood that a plurality of candidate shift positions have been calculated in the candidate shift position calculating step (S212).

As described above, with respect to all the calculated candidate shift positions, the contrast average value $C_{ave}$ of all the detection pixels 223, and the contrast variation $C_{sig}$ of all the detection pixels 223 are acquired.

In the contrast variation sorting step (S250), the sort unit 96 performs sorting to rearrange all the calculated candidate shift positions to be in order of the contrast variation $C_{sig}$ from the smallest $C_{sig}$. Then, an index number i'=1 to N is newly given to each of all the calculated candidate shift positions, in order of the contrast variation $C_{sig}$ from the smallest $C_{sig}$. Since the number of candidate shift positions is not changed, the index numbers i' are values from 1 to N.

In the candidate shift position selecting step (S252), the selection unit 97 selects one candidate shift position, along the order of the arrangement, from a plurality of candidate shift positions arranged from the smallest contrast variation $C_{sig}$. Here, the index number i'=1 is selected.

In the determining step (S254), the average value comparison unit 86 compares a calculated contrast average value $C_{ave}$ and the average value threshold $Th_{ave}$. Specifically, the average value comparison unit 86 determines whether the contrast average value $C_{ave}$ of all the detection pixels 223 is greater than the average value threshold $Th_{ave}$ in the case where each secondary electron beam 11 is detected at the candidate shift position designated by the index number i'. When the contrast average value $C_{ave}$ of all the detection pixels 223 is greater than the average value threshold $Th_{ave}$, it goes to the determining step (S256). When the contrast average value $C_{ave}$ of all the detection pixels 223 is not greater than the average value threshold $Th_{ave}$, it goes to the determining step (S258).

In the determining step (S256), the contrast variation comparison unit 88 compares a calculated contrast variation $C_{sig}$ and the variation threshold $Th_{sig}$. Specifically, the contrast variation comparison unit 88 determines whether the contrast variation $C_{sig}$ of all the detection pixels 223 is smaller than the variation threshold $Th_{sig}$ in the case where each secondary electron beam 11 is detected at the candidate shift position designated by the index number i'. When the contrast variation $C_{sig}$ of all the detection pixels 223 is smaller than the variation threshold $Th_{sig}$, it goes to the shift position setting step (S270). When the contrast variation $C_{sig}$ of all the detection pixels 223 is not smaller than the variation threshold $Th_{sig}$, it goes to the determining step (S258).

In the determining step (S258), the determination unit 98 determines whether the index number i' being currently set is the last number N or not. When the index number i' is not the last number N, it goes to the changing step (S260). When the index number i' is the last number N, an alarm to prompt replacement of the multi-detector 222 is output, and it ends.

In the changing step (S260), the change unit 99 changes, along the order of the arrangement, the candidate shift position of the index number i' being currently set to another candidate shift position in a plurality of candidate shift positions arranged in order of the contrast variation $C_{sig}$ from the smallest $C_{sig}$. Here, it is changed to the candidate shift position designated by the index number obtained by adding 1 to the index number i'.

Then, it returns to the determining step (S254), and each step from the determining step (S254) to the changing step (S260) is repeated until it is determined in the determining step (S254) that the contrast average value $C_{ave}$ of all the detection pixels 223 is greater than the average value threshold $Th_{ave}$, or it is determined in the determining step (S258) that the index number i' is the last number N. Thereby, it is possible to search/detect, in order of the contrast variation $C_{sig}$ from the smallest $C_{sig}$, a candidate shift position where the contrast average value $C_{ave}$ is greater than the average value threshold $Th_{ave}$, and the contrast variation $C_{sig}$ is smaller than the variation threshold $Th_{sig}$.

In the shift position setting step (S270), when sensitivity of at least one detection pixel 223 has been degraded, the setting unit 74 sets a shifting destination of the irradiation position of each of the multiple secondary electron beams 300, which irradiate a plurality of detection pixels 223, to be within a corresponding same detection pixel 223. Specifically, based on a comparison result of the contrast average value $C_{ave}$ and a comparison result of the contrast variation $C_{sig}$, the setting unit 74 sets shifting destinations of the irradiation positions of the multiple secondary electron beams 300 to be within respective corresponding detection pixels. More specifically, the setting unit 74 finally sets the coordinates of the shift position to be coordinates of a candidate shift position where the irradiation position with small contrast variation $C_{sig}$ is selected with priority, the contrast average value $C_{ave}$ is greater than the average value threshold $Th_{ave}$, and the contrast variation $C_{sig}$ is smaller than the variation threshold $Th_{sig}$.

In the irradiation position shifting step (S272), the movement processing unit 76 outputs a control signal for moving the detection stage 221, to the detector drive control circuit 136. Then, by moving the detection stage 221 (example of shifting unit), the detector drive control circuit 136 mechanically shifts arrangement positions of a plurality of detection pixels 223 corresponding to the multiple secondary electron beams 300. By the movement of the detection stage 221, each of the irradiation positions of the multiple secondary electron beams 300, which irradiate a plurality of detection pixels 223, is moved (shifted) to a shift position in the corresponding same light-receiving region of the detection pixel 223 concerned. Alternatively, the movement processing unit 76 outputs a control signal for moving the deflection position of the deflector 228, to the deflection control circuit 128. Then, by moving the deflection position of the deflector 228 (another example of shifting unit), the deflection control circuit 128 may electromagnetically shift the irradiation positions of the multiple secondary electron beams 300, which irradiate a plurality of detection pixels 223, to positions to be shifted. In either case, here, the irradiation position is switched (shifted) in the same detection pixel 223 to be irradiated with each corresponding secondary electron beam 11. Consequently, the position specified in S270, such as the irradiation position of the secondary electron beam 11 in each detection pixel 223, as shown in the example of FIG. 10, is shifted to an adjacent irradiation position in the same detection pixel 223.

As described above, in the light-receiving region of each detection pixel 223, the secondary electron beam 11 can be detected at a shift position which has not been used for detection of the secondary electron beam 11, and on which the contrast average value $C_{ave}$ is greater than the average value threshold $Th_{ave}$, and the contrast variation $C_{sig}$ is smaller than the variation threshold $Th_{sig}$. Thereby, sensitivity of a degraded pixel can be corrected. Therefore, sensitivity of the multi-detector 222 can be improved. Similarly to the first embodiment, it is preferable that the flows of the sensitivity correction method of the multi-detector 222 shown in FIGS. 5 and 8 are executed each time before performing inspection of the inspection target substrate 101. Alternatively, the flows may be performed periodically, not performed for each substrate 101. Then, inspection processing of the inspection target substrate 101 is performed using the multi-detector 222 whose sensitivity has been corrected. The main steps of the inspection method according to the third embodiment are the same as those of FIG. 11.

As described above, according to the third embodiment, the candidate shift position can be searched/detected in order of the contrast variation $C_{sig}$ from the smallest $C_{sig}$. Therefore, it is possible to perform adaptation of the shift position in the light-receiving region of the detection pixel 223 more suitably than the second embodiment. Accordingly, the life of the multi-detector 222 used in the case of acquiring images by using multiple beams can be extended with greater accuracy than the second embodiment. Thus, the operating rate (utilization ratio) of the inspection apparatus 100 can be improved.

In the above description, each " . . . circuit" includes a processing circuitry. As the processing circuitry, for example, an electric circuit, computer, processor, circuit board, quantum circuit, semiconductor device, or the like can be used. Each " . . . circuit" may use a common processing circuitry (same processing circuitry), or different processing circuitries (separate processing circuitries). A program for causing a processor to execute processing may be stored in a recording medium, such as a magnetic disk drive, magnetic tape drive, FD, ROM (Read Only Memory), etc. For example, the position circuit 107, the comparison circuit 108, the reference image generation circuit 112, the evaluation pattern measurement circuit 130, the degraded pixel detection circuit 132, the irradiation position adjustment circuit 134, etc. may be configured by at least one processing circuitry described above.

Embodiments have been explained referring to specific examples described above. However, the present invention is not limited to these specific examples.

While the apparatus configuration, control method, and the like not directly necessary for explaining the present invention are not described, some or all of them can be selectively used on a case-by-case basis when needed.

In addition, any other pattern inspection apparatus and pattern inspection method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple beam inspection apparatus comprising:
a stage configured to mount thereon a target object on which a pattern is formed;
a multiple-beam column configured to irradiate the target object with multiple primary electron beams;
a multi-detector configured to detect multiple secondary electron beams generated due to that the target object is irradiated with the multiple primary electron beams, and to include a plurality of detection pixels each of which receives irradiation of a corresponding secondary electron beam in the multiple secondary electron beams, and the each of which has a region formed to be capable of receiving the irradiation of the corresponding secondary electron beam and to be larger than a size of an irradiation spot of the corresponding secondary electron beam;
an inspection circuitry configured to inspect the pattern, using information on the multiple secondary electron beams detected by the multi-detector;
a shifting mechanism configured to shift irradiation positions of the multiple secondary electron beams which irradiate the plurality of detection pixels;
a degradation determination circuitry configured to determine whether sensitivity of at least one detection pixel in the plurality of detection pixels has been degraded; and
a setting circuitry configured to, in a case where the sensitivity of the at least one detection pixel has been degraded, set shifting destinations of the irradiation positions of the multiple secondary electron beams which irradiate the plurality of detection pixels such that a shifting destination of an irradiation position of each of the multiple secondary electron beams is within each corresponding same detection pixel.

2. The apparatus according to claim 1, further comprising:
a first contrast calculation circuitry configured to calculate a contrast of a secondary electron beam image for the each of the plurality of detection pixels, based on a detection result obtained in a case of detecting, by the multi-detector, multiple secondary electron beams obtained by scanning an evaluation pattern with the multiple primary electron beams;
a first comparison circuitry configured to, for the each of the plurality of detection pixels, compare the contrast calculated with a reference contrast acquired in advance, and to determine, based on a comparison result, whether there is a candidate for a degradation detection pixel having a possibility of the sensitivity degraded;
a shift circuitry configured to, in a case of there being the candidate for the degradation detection pixel, shift the plurality of detection pixels to be irradiated with respective secondary electron beams of the multiple secondary electron beams;
a second contrast calculation circuitry configured to, in a state where the plurality of detection pixels have been shifted, calculate a contrast of the secondary electron beam image, with respect to the candidate for the degradation detection pixel, based on a detection result of the candidate for the degradation detection pixel in the case of detecting, by the multi-detector, the multiple secondary electron beams obtained by scanning the evaluation pattern with the multiple primary electron beams; and
a second comparison unit configured to, with respect to the candidate for the degradation detection pixel, compare the contrast calculated with the reference contrast acquired in advance, wherein
the degradation determination circuitry determines whether sensitivity of the candidate for the degradation detection pixel has been degraded, based on a comparison result with respect to the candidate for the degradation detection pixel obtained in the state where the plurality of detection pixels have been shifted.

3. The apparatus according to claim 1, wherein the shifting mechanism shifts the irradiation positions of the multiple secondary electron beams at least once, further comprising:

a contrast calculation circuitry configured to calculate a contrast of a secondary electron beam image for the each of the plurality of detection pixels, in a state where the irradiation positions of the multiple secondary electron beams have been shifted at least once, based on a detection result obtained in a case of detecting, by the multi-detector, multiple secondary electron beams obtained by scanning an evaluation pattern with the multiple primary electron beams;

an average value calculation circuitry configured to calculate an average value of the contrast of all detection pixels of the plurality of detection pixels;

an average value comparison circuitry configured to compare a calculated average value of the contrast with an average value threshold;

a contrast variation calculation circuitry configured to calculate a variation of the contrast of the all detection pixels of the plurality of detection pixels; and a contrast variation comparison circuitry configured to compare a calculated variation of the contrast with a variation threshold, wherein the setting circuitry sets the shifting destinations of the irradiation positions of the multiple secondary electron beams to be within respective corresponding detection pixels, based on a comparison result of the average value and a comparison result of the variation.

4. The apparatus according to claim 1, wherein the shifting mechanism mechanically shifts arrangement positions of the plurality of detection pixels corresponding to the multiple secondary electron beams.

5. The apparatus according to claim 1, wherein the shifting mechanism electromagnetically shifts the irradiation positions of the multiple secondary electron beams which irradiate the plurality of detection pixels.

6. The apparatus according to claim 1, wherein the shifting mechanism includes a detection stage which is movable and on which the multi-detector is placed.

7. The apparatus according to claim 6, wherein, by moving the detection stage, an irradiation position of each secondary electron beam of the multiple secondary electron beams is shifted in a same detection pixel to be irradiated with the each secondary electron beam.

8. The apparatus according to claim 1, wherein the shifting mechanism includes a deflector to deflect the multiple secondary electron beams to the multi-detector.

9. The apparatus according to claim 8, wherein, by moving a deflection position of the multiple secondary electron beams by the deflector, an irradiation position of each secondary electron beam of the multiple secondary electron beams is shifted in a same detection pixel to be irradiated with the each secondary electron beam.

10. A sensitivity correction method for multi-detector comprising:

detecting multiple secondary electron beams generated due to that an evaluation pattern is irradiated with multiple primary electron beams, by a multi-detector including a plurality of detection pixels each of which receives irradiation of a corresponding secondary electron beam in the multiple secondary electron beams, and the each of which has a region formed to be capable of receiving the irradiation of the corresponding secondary electron beam and to be larger than a size of an irradiation spot of the corresponding secondary electron beam;

determining whether sensitivity of at least one detection pixel in the plurality of detection pixels has been degraded;

shifting, in a case where the sensitivity of the at least one detection pixel has been degraded, irradiation positions of the multiple secondary electron beams, which irradiate the plurality of detection pixels, in respective corresponding detection pixels, and setting, in the case where the sensitivity of the at least one detection pixel has been degraded, shifting destinations of the irradiation positions of the multiple secondary electron beams which irradiate the plurality of detection pixels such that a shifting destination of an irradiation position of each of the multiple secondary electron beams is within each corresponding same detection pixel.

* * * * *

UNITED STATES PATENT AND TRADEMARK OFFICE
CERTIFICATE OF CORRECTION

PATENT NO. : 10,840,057 B2  
APPLICATION NO. : 16/237768  
DATED : November 17, 2020  
INVENTOR(S) : Koichi Ishii et al.

Page 1 of 1

It is certified that error appears in the above-identified patent and that said Letters Patent is hereby corrected as shown below:

In the Specification

In Column 11, Line 29, delete "(C-C0)" and insert -- (C0-C) --,

In Column 11, Line 32, delete "(C-C0)" and insert -- (C0-C) --,

In Column 11, Line 36, delete "(C-C0)" and insert -- (C0-C) --,

In Column 14, Line 17, delete "(C-C0)" and insert -- (C0-C) --,

In Column 14, Line 31, delete "(C-C0)" and insert -- (C0-C) --,

In Column 14, Line 44, delete "(C-C0)" and insert -- (C0-C) --, and,

In Column 14, Line 55, delete "(C-C0)" and insert -- (C0-C) --.

Signed and Sealed this  
Nineteenth Day of October, 2021

Drew Hirshfeld  
*Performing the Functions and Duties of the*  
*Under Secretary of Commerce for Intellectual Property and*  
*Director of the United States Patent and Trademark Office*